(12) United States Patent
Delic

(10) Patent No.: US 10,697,829 B2
(45) Date of Patent: Jun. 30, 2020

(54) SPAD ARRAY STRUCTURES AND METHODS OF OPERATION

(71) Applicant: The Commonwealth of Australia, Edinburgh (AU)

(72) Inventor: Dennis Victor Delic, Canberra Airport (AU)

(73) Assignee: The Commonwealth of Australia, Edinburgh (AU)

(*) Notice: Subject to any disclaimer, the term of this patent is extended or adjusted under 35 U.S.C. 154(b) by 184 days.

(21) Appl. No.: 15/741,874

(22) PCT Filed: Jul. 8, 2016

(86) PCT No.: PCT/AU2016/000247
§ 371 (c)(1),
(2) Date: Jan. 4, 2018

(87) PCT Pub. No.: WO2017/004663
PCT Pub. Date: Jan. 12, 2017

(65) Prior Publication Data
US 2018/0195900 A1 Jul. 12, 2018

(30) Foreign Application Priority Data
Jul. 8, 2015 (AU) ................................ 2015902699

(51) Int. Cl.
*G01J 1/44* (2006.01)
*G01T 1/24* (2006.01)
(Continued)

(52) U.S. Cl.
CPC ................ *G01J 1/44* (2013.01); *G01T 1/248* (2013.01); *G06F 13/38* (2013.01); *H01L 27/144* (2013.01);
(Continued)

(58) Field of Classification Search
CPC ...... G01J 1/44; G06F 13/38; H01L 27/14609; H01L 31/107
See application file for complete search history.

(56) References Cited

U.S. PATENT DOCUMENTS 9,176,241 B2 11/2015 Frach
9,354,332 B2 5/2016 Zwaans et al.
(Continued)

FOREIGN PATENT DOCUMENTS

EP 2469301 A1 6/2012
WO 2012137109 A2 10/2012
(Continued)

*Primary Examiner* — Georgia Y Epps
*Assistant Examiner* — Don J Williams
(74) *Attorney, Agent, or Firm* — The Webb Law Firm

(57) ABSTRACT

Compact Single Photon Avalanche Diode (SPAD) array structures are described. An on board common trigger circuit is used for two or more SPAD structures. The common trigger includes a compact counter and flash memory constructed adjacent two or more SPAD structures. Triggering of a SPAD latches the value of the counter and the value is stored in the memory along with the ID of the triggering SPAD. The counter continues counting, and if another SPAD subsequently triggers, the counter is again latched and the value is stored in the memory along with the ID of the subsequently triggering SPAD. The memory can be read and the triggering circuit reset. Methods for designing compact SPAD structures, a compact active quenching circuit and a compact 16 bit counter are described.

16 Claims, 15 Drawing Sheets

(51) Int. Cl.
*H01L 27/146* (2006.01)
*H01L 27/144* (2006.01)
*H01L 31/107* (2006.01)
*G06F 13/38* (2006.01)

(52) U.S. Cl.
CPC ...... *H01L 27/14609* (2013.01); *H01L 31/107* (2013.01)

(56) References Cited

U.S. PATENT DOCUMENTS

| | | |
|---|---|---|
| 9,677,931 B2 | 6/2017 | Shaber |
| 2006/0192086 A1 | 8/2006 | Niclass et al. |
| 2006/0202129 A1 | 9/2006 | Niclass et al. |
| 2007/0182949 A1 | 8/2007 | Niclass |
| 2013/0193546 A1* | 8/2013 | Webster .............. H01L 27/1443 257/438 |
| 2013/0300838 A1 | 11/2013 | Borowski |
| 2014/0175294 A1* | 6/2014 | Frach .................... H04N 5/369 250/363.03 |
| 2014/0217264 A1* | 8/2014 | Shepard ............. G01N 21/6458 250/208.1 |

FOREIGN PATENT DOCUMENTS

| | | |
|---|---|---|
| WO | 2013018006 A1 | 2/2013 |
| WO | 2014173644 A1 | 10/2014 |

* cited by examiner

SPAD ARRAY STRUCTURES AND METHODS OF OPERATION

CROSS-REFERENCE TO RELATED APPLICATIONS

This application is the United States national phase of International Application No. PCT/AU2016/000247 filed Jul. 8, 2016, and claims priority from Australian Provisional Patent Application No. 2015902699 titled "SPAD ARRAY STRUCTURES AND METHODS OF OPERATION" and filed Jul. 8, 2015, the content of which is hereby incorporated by reference in its entirety.

TECHNICAL FIELD

The present disclosure relates to sensor circuits comprising an array of Single-Photon Avalanche Diode (SPAD) circuits.

BACKGROUND

Avalanche photodiodes (APDs) are solid-state photodetectors in which a high bias voltage is applied to a p-n junction to provide a high first stage gain due to avalanche multiplication. Avalanche multiplication occurs when an incident photon with sufficient energy to liberate an electron arrives at the photodiode. The high electric field rapidly accelerates the photo-generated electron towards the anode, but before it can reach the anode, it collides with the intervening doped material releasing further electrons, all of which are then accelerated towards the anode. This process repeats leading to avalanche multiplication of the photo-generated electron and an output current pulse. APDs are thus semiconductor analogs to photomultiplier tubes. Linear mode APDs are effectively single stage linear amplifiers in which the gain is set by controlling the bias voltage, and with gain factors of several hundred can be achieved in linear mode.

Single-Photon Avalanche Diodes (SPADs) are APDs in which the p-n junction is biased above its breakdown voltage to operate in Geiger mode such that a single incident photon will trigger an ongoing avalanche breakdown and thus easily measurable current pulse. That is a SPAD operates as a trigger device generating a large current pulse compared to linear mode APDs in which the current pulses can be very low at low light intensity. After triggering of the SPAD, a quenching circuit is used to reduce the bias voltage below the breakdown voltage in order to quench the avalanche process. Once quenched the bias voltage is again raised above the breakdown voltage to reset the SPAD for detection of another photon (known as re-biasing the SPAD).

APD and SPADs are solid state devices and can be constructed using a variety of CMOS technologies, and have very small active areas compared with other photon counting devices such as photomultiplier tubes. Through appropriate choice of materials and structure, wavelength sensitivity of a SPAD can be controlled to be in the visible and/or near-infrared range. A SPAD combined with additional circuitry to count pulses and/or measure time of arrival of photons to sub-nano/pico second accuracy can be used to create sensors for ultra-low light imaging or highly sensitive time-resolved imaging applications. For example one potential application of a SPAD arrays are in three dimensional (3D) Flash LIDAR cameras, as they have the potential to provide extremely sensitive devices with high distance resolution and high frame rates. SPAD arrays also have potential for use in other applications that require single photo sensitivity with high frames such as biological/medical imaging applications, adaptive optics applications, and astrophysics applications.

Three dimensional Flash LIDAR systems, also known as 3D Time of Flight (TOF) Cameras, use a laser source to irradiate a target with a short duration laser pulse (ie a laser flash). Photons are back scattered off objects and onto the sensor and the time of arrival is used to determine time of flight and thus distance to an object. The first 3D TOF cameras were constructed as scanning laser systems comprising a laser range finder with a rotating or scanning element(s) to progressively scan the field of view. These scanning systems are effectively single pixel devices collecting time of flight information in a single direction which build up a 3D image progressively moving the pointing direction of the sensing element. More recently scanner-less (ie staring) 3D Flash LIDAR systems have been developed using a two dimensional array of linear mode APDs (pixels) to achieve more rapid scene capture than scanning systems, and to avoid problems with scanning systems such as mechanical wear, vibration, and/or motion blur. By rapidly resetting APDs after triggering, each pixel can be used to receive multiple photons from the laser pulse, each corresponding to different distance. In this way, a 3D point cloud of the target scene can be rapidly generated.

SPAD arrays in 3D Flash LIDAR systems have the potential to achieve even greater light sensitivity with high distance resolution and high frame rates than scanning laser systems or scanner-less APD based systems. However, achieving high spatial resolution with a SPAD array has proved challenging and most SPAD arrays are experimental with only a relatively small number of pixels (eg 6×8, 32×32). In particular SPADs require the use of very high voltages, and design of efficient SPAD structure is a difficult problem. Further each SPAD requires an adjacent quenching circuit and a triggering detection (ie time of arrival) circuit, all of which takes up additional space on the substrate immediately surrounding the SPAD.

There is thus a need to provide improvements to allow construction of high density SPAD arrays, or at least provide a useful alternative to current SPAD array systems.

SUMMARY

According to a first aspect, there is provided a Single-Photon Avalanche Diode (SPAD) array comprising a plurality of SPAD cells, each SPAD cell comprising:
  a plurality (n) of SPAD structures;
  a plurality (n) quenching circuits, each quenching circuit connected to one of the SPAD structures;
  a common trigger circuit connected to each of the SPAD structures and further comprising:
    a counter;
    a memory,
    a plurality (n) of latches each connected to a SPAD structure and a logic circuit connected to the plurality of latches and configured to stop the counter if all of the latches are triggered;
    a pulse latch and write circuit with a plurality (n) of inputs, each input connected to a SPAD structure and configured to detect an output pulse from a SPAD structure, and each time an output pulse is detected the SPAD ID of the SPAD structure the output pulse was detected from is provided to the memory and the value of the counter is read and stored in memory with the SPAD ID.

In one form, the counter is at least a 16 bit counter.

In one form, the memory is configured to store n−1 values and each value has bit size of at least the bit size of the counter, plus the number of bits required to represent n−1.

In one form, n=2.

In one form, the array is at least a 128×128 cell array.

In one form, each SPAD structure comprises a Pwell region comprising at least one anode and an active region, a Pdrift region, and an Nwell region comprising at least one cathode, wherein the Pdrift region overlaps with the Pwell region.

In further form, in each SPAD structure the Pwell region is a circular disk region extending from a top surface of the SPAD into the Nwell region, the Pdrift region is an annular region with a thickness greater than the thickness of the Pwell region and extending radially from the Pwell region, and extending beneath the Pwell region into the Nwell region to define an overlapping region.

In a further form, in each SPAD structure the ratio of a width of the overlapping region to the diameter of the active region is in the range 0.05 to 0.25.

In one form, each SPAD structure comprises a Pwell region comprising at least one anode, an active region, a Pdrift region in an implantation region, and a Nwell region comprising at least one cathode, wherein a top surface of the active region of the SPAD is exposed and a top surface of the Nwell region is covered with one or more shallow trench isolation (STI) regions, and a polysilicon gate (Poly) region is placed over a top surface of the implantation region apart from the exposed active region and extends over a portion of the top surface of the Nwell region to separate one or more STI regions from the implantation region.

In a further form, each SPAD structure the polysilicon gate is kept at the same potential as the Pwell region.

According to a second aspect, there is provided a method for recording triggering times of a plurality of SPAD structures, the method comprising:

starting a counter in a cell;
  detecting each output pulse from one of the plurality of SPAD structures in the cell;
  for the first n−1 detected output pulses capturing the value of the counter and storing the counter value in a memory with a SPAD ID of the SPAD structure the output pulse was detected from; and
  for the nth the detected output pulse either stopping the counter or capturing the value of the counter and storing the counter value in the memory with a SPAD ID of the SPAD structure the output pulse was detected from; and
  reading each stored counter value and associated SPAD ID from the memory and reading the current counter value if it was stopped by the nth the detected output pulse In one form, for the nth the detected output pulse the counter is stopped.

In one form, after each detected output pulse from one of the plurality of SPAD structures the SPAD that generated the output pulse is re-biased and for the nth and each subsequent detected output pulse the value of the counter is captured and the counter value is stored in the memory with a SPAD ID of the SPAD structure the output pulse was detected from.

In one form, the method further comprises stopping the counter prior to or at the same time as the reading step if it is not already stopped, and resetting the counter and memory after the reading step.

In one form, the counter is at least a 16 bit counter.

In one form the number of SPAD structures in the cell is two.

According to a third aspect, there is provided a SPAD structure comprising a Pwell region comprising at least one anode and an active region, a Pdrift region, and a Nwell region comprising at least one cathode, wherein the Pdrift region overlaps with the Pwell region.

In one form the Pwell region is a circular disk region extending from a top surface of the SPAD into the Nwell region, the Pdrift region is an annular region with a thickness greater than the thickness of the Pwell region and extending radially from the Pwell region, and extending beneath the Pwell region into the Nwell region to define an overlapping region.

In one form the ratio of a width of the overlapping region to diameter of the active region is in the range 0.05 to 0.25.

According to a fourth aspect, there is provided a SPAD structure comprising a Pwell region comprising at least one anode, an active region, a Pdrift region in an implantation region, and a Nwell region comprising at least one cathode, wherein a top surface of the active region of the SPAD is exposed and a top surface of the Nwell region is covered with one or more shallow trench isolation (STI) regions, and a polysilicon gate (Poly) region is placed over a top surface of the implantation region apart from the exposed active region and extends over a portion of the top surface of the Nwell region to separate one or more STI regions from the implantation region.

In one form the polysilicon gate is kept at the same potential as the Pwell region.

BRIEF DESCRIPTION OF DRAWINGS

Embodiments will be discussed with reference to the accompanying drawings wherein.

In the following description, like reference characters designate like or corresponding parts throughout the figures.

DESCRIPTION OF EMBODIMENTS

Embodiments of SPAD structures and circuits to allow the construction of compact and/or high density SPAD array systems will now be described. Embodiments of a compact triggering circuit, compact SPAD structures, a compact active quenching circuit and a compact counter circuit are described. Associated methods of operation of the triggering circuit and design of compact SPAD structures are also described. Embodiments of these structures and methods were used to construct a 32×32 cell SPAD array (ie 1024 pixels), a 128×128 dual SPAD cell Array equivalent to a 128×256 SPAD array (32768 pixels), and can be used to create even higher density SPAD arrays.

Figure 1:
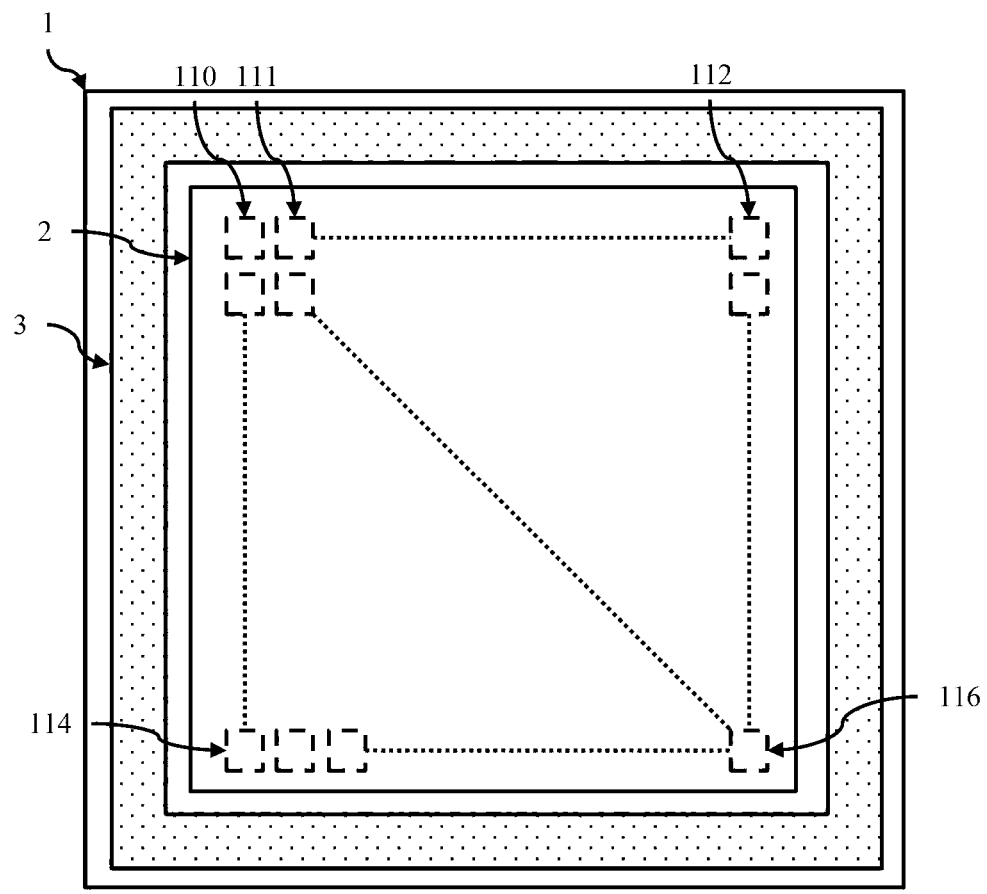
FIG. 1 is a schematic diagram of a SPAD array sensor according to an embodiment.

Referring now to FIG. 1, there is shown a schematic diagram of a SPAD array sensor 1 according to an embodiment. The SPAD array sensor comprises a SPAD array 2 and a SPAD Array control circuit 3. The SPAD array 2 comprises an array of SPAD cells 110, arranged in n rows and m columns (ie a n×m array). This is illustrated in FIG. 1, in which the first row comprises a first SPAD cell 10 in the first column, a second SPAD cell 111 in the second column, etc to the mth SPAD cell 112 in the mth column. This structure is repeated for n rows, and thus the nth row comprises the ((n−1)×m)+1 th SPAD cell 114 in the first column of the nth row to then n×m th SPAD cell 116 in the mth column of the nth row. The SPAD array control circuit performs a range of functions such as providing power to the array, and controlling triggering (eg trigger enablement and reset) of cells, and reading of data from cells in the array.

Figure 2A:
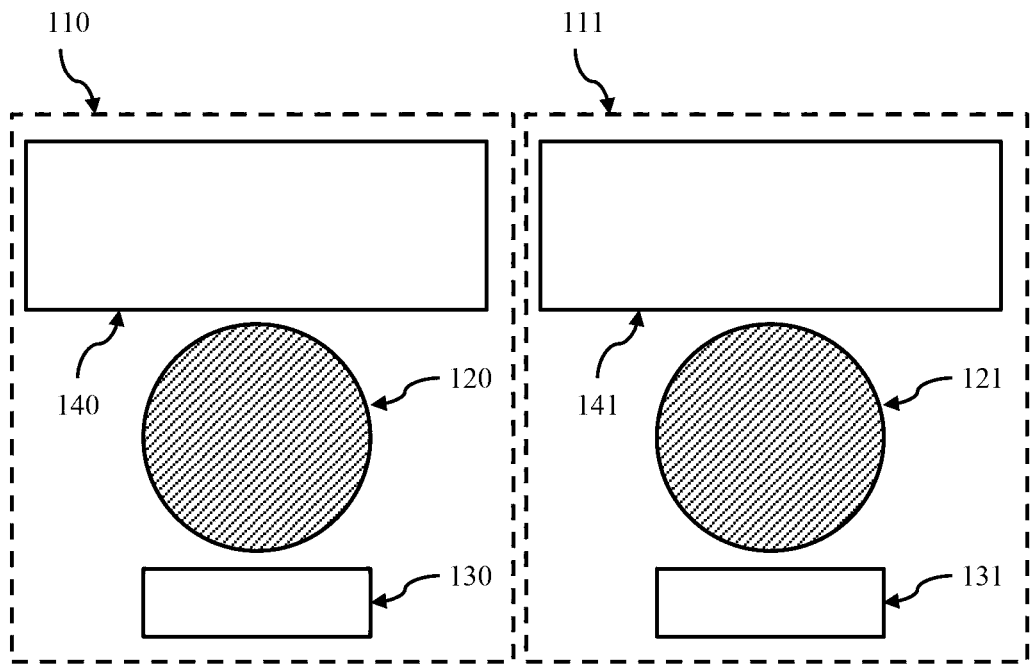
FIG. 2A is a schematic diagram of adjacent SPAD cells according to an embodiment.

FIG. 2A is a schematic diagram of adjacent SPAD cells 110 and 111 according to an embodiment. In this embodiment the first SPAD cell 110 comprises a SPAD structure 120, a quenching circuit 130, and a triggering circuit 130. The second SPAD cell 111 is of identical construction to the first SPAD cell, and comprises a second SPAD structure 121, a second quenching circuit 131, and a second triggering circuit 131. In one embodiment the quenching circuits 120, 121 are analog circuits and the triggering circuits 130, 131 are digital circuits.

The SPAD sensor 1 may be constructed using a range of CMOS technologies, for example from 0.8 µm down to 65 nm (and potentially lower) incorporating multiple metal layers and voltages, and may be designed using VLSI and related IC chip design techniques. In one embodiment the SPAD array sensor is constructed as a monolithic CMOS wafer comprised of the SPAD array 2 and the SPAD control circuit 3. In other embodiments, multi-wafer layering techniques can be used, in which the top wafer layer is a comprised of an array of SPAD structures, and the lower wafer layer(s) comprise associated SPAD structure quenching circuit and triggering circuits connected to SPAD structures in the top wafer layer, and the SPAD array control circuit 3.

The SPAD structure 120 comprises an active region, within which an incident photo will generate an output current pulse, which may also be referred to as a trigger pulse as well as anode and cathode connections for application of the bias voltage and detection of the trigger pulse. Various SPAD structures may be used and design criteria for SPAD structures are discussed below. Different SPAD structures will have different efficiencies and characteristics. Example SPAD structures are illustrated in FIGS. 5A to 5D and are discussed below.

The quenching circuit 130 is used to control the bias voltage applied to the SPAD structure 20 and quench (ie stop) the avalanche process by reducing the bias voltage below the breakdown voltage. The quenching circuit may also be referred to as a quenching and recharge circuit, as once the avalanche process is quenched, the bias voltage is again raised to the operational voltage above the breakdown voltage to allow the SPAD to be triggered again. Quenching may be performed using active or passive quenching. Passive quenching is performed by providing a resistance in series to the SPAD. The avalanche current self-quenches simply because it develops a voltage drop across the resistance (a high-value ballast load), reducing the voltage across the SPAD to below its breakdown voltage. After the quenching of the avalanche current, the SPAD's bias slowly recovers to at or above the breakdown voltage.

An alternative to passive quenching is active quenching. An active quenching circuit detects avalanche breakdown by a digital logic circuit or component, for example a transistor acting as a resistive element or a transistor based circuit connected to the SPAD output. Upon detection of a trigger pulse, the active quenching circuit actively pulls the bias voltage to a voltage below breakdown to quench the avalanche, before switching the voltage back to the operational voltage. Compared to passive quenching, active quenching circuits occupies less space on the chip and have reduced dead time, as well as providing options such as time gating of the SPAD to synchronise with firing of a laser pulse. There are a number of different active quenching arrangements that have been used, but these often take up considerable space. An embodiment of an active quenching circuit is illustrated in FIG. 6B. An embodiment of this circuit can that can be compactly laid out on a wafer using CMOS techniques. In this embodiment the quenching circuit is an analog circuit and the triggering circuit is a digital circuit.

A triggering circuit 140 detects the SPAD output pulse, which will also be referred to as the trigger pulse, and is configured to store the triggering time which is then sent to the SPAD control circuit 3. In one embodiment the trigger circuit comprises a counter. The counter is initiated (started) upon receipt of a start signal, for example a signal generated upon a laser being fired, and which may also be used to switch the SPAD into an operational mode. Upon detection of the trigger pulse, for example by detecting the rise of the trigger pulse or a level change, the counter is stopped, and the value can then read and send to the control circuit 3. In time of flight applications, the larger the counter then the greater the range of the sensor. However the layout of counters on the wafer takes up considerable space, and thus the larger the counter then the greater the space is required for each cell. The counter may be a flip-flop based counter, and may continue to count until a stop signal is received or the counter reaches a stop or maximum value. In one embodiment the stop signal is sent at the end of a defined time period (time-out or gate period), for example to a stop the counter and trigger read out of trigger times from the SPAD array (or the current row or column in the SPAD array). In one embodiment a linear time to voltage or time to digital converter (TDC) circuit is used. In one embodiment detection of the trigger pulse triggers linear charging of a capacitor. At a specified read out time (eg clock signal) charging is stopped, and the value of the capacitor is read and converted to a charging time. This charging time can be subtracted from the read out time to determine the triggering time. An inverse arrangement can also be used in which linear charging of the capacitor begins upon receipt of a start signal (eg upon firing of a laser pulse), and which could also be used to switch the SPAD into an operational mode. Upon detection of the trigger pulse (eg by detecting the rise of the trigger pulse), charging of the capacitor is stopped. Upon receipt of a readout signal, the value of the capacitor is determined and converted to a time since the start signal.

Figure 2B:
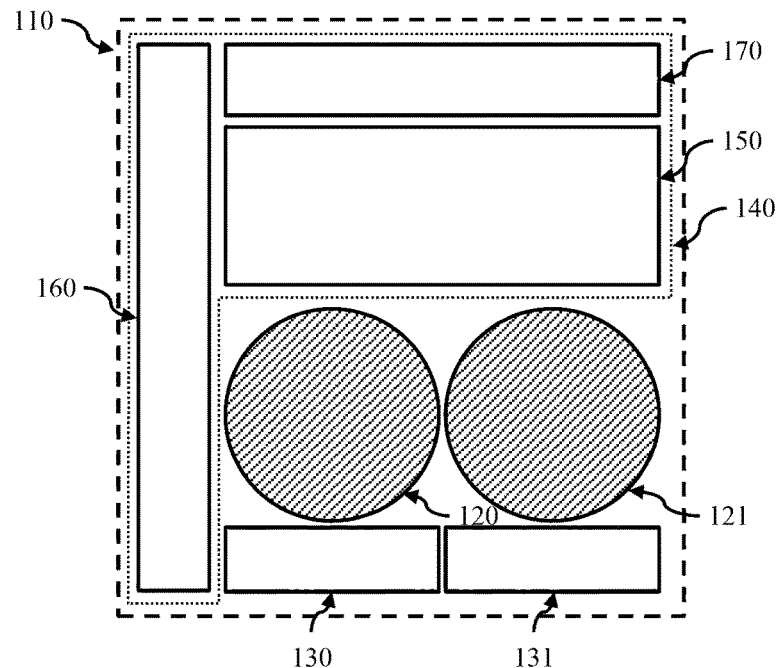
FIG. 2B is a schematic diagram of a SPAD cell comprising two SPAD structures and quenching circuits and a combined trigger circuit according to an embodiment.

In one embodiment, each SPAD cell 110 comprises multiple SPAD structures and uses a common trigger circuit featuring a common counter and memory to gain an effective size reduction. That is by using a common counter and memory arrangement, the additional size of the triggering circuit is effectively shared between the SPADs so the size of the multi SPAD cell is smaller than multiple single SPAD cells with the same counter size. This approach thus provides the ability to have larger counters (eg 16 bits or more) whilst maintaining or increasing packing density, ie number of SPADs on the chip. To illustrate this FIG. 2B is a schematic diagram of an embodiment a SPAD cell 110 comprising two SPAD structures 120 121 and quenching circuits 130 131, and a common trigger circuit 140 (a dual SPAD cell). In this embodiment a first SPAD structure 120 is connected to a first quenching circuit 130. Similarly a second SPAD structure 121 is connected to a second quenching circuit 131. In contrast to the arrangement shown in FIG. 2A, a common trigger circuit 140 is used to record triggering of both SPAD structures 120 and 121 in conjunction with a memory circuit 160. In this arrangement the common trigger circuit 140 comprises a counter 150, which will also be referred to as a common counter to denote it is used by multiple SPADs in the cell. Upon detection of a trigger pulse from either the first SPAD structure 120, or the second SPAD structure 121, the value of the counter 150 is captured (or latched). The captured (or latched) counter value is then passed to the memory circuit 160 for storage, along with the ID of the SPAD from which the trigger pulse was received.

Figure 3A:
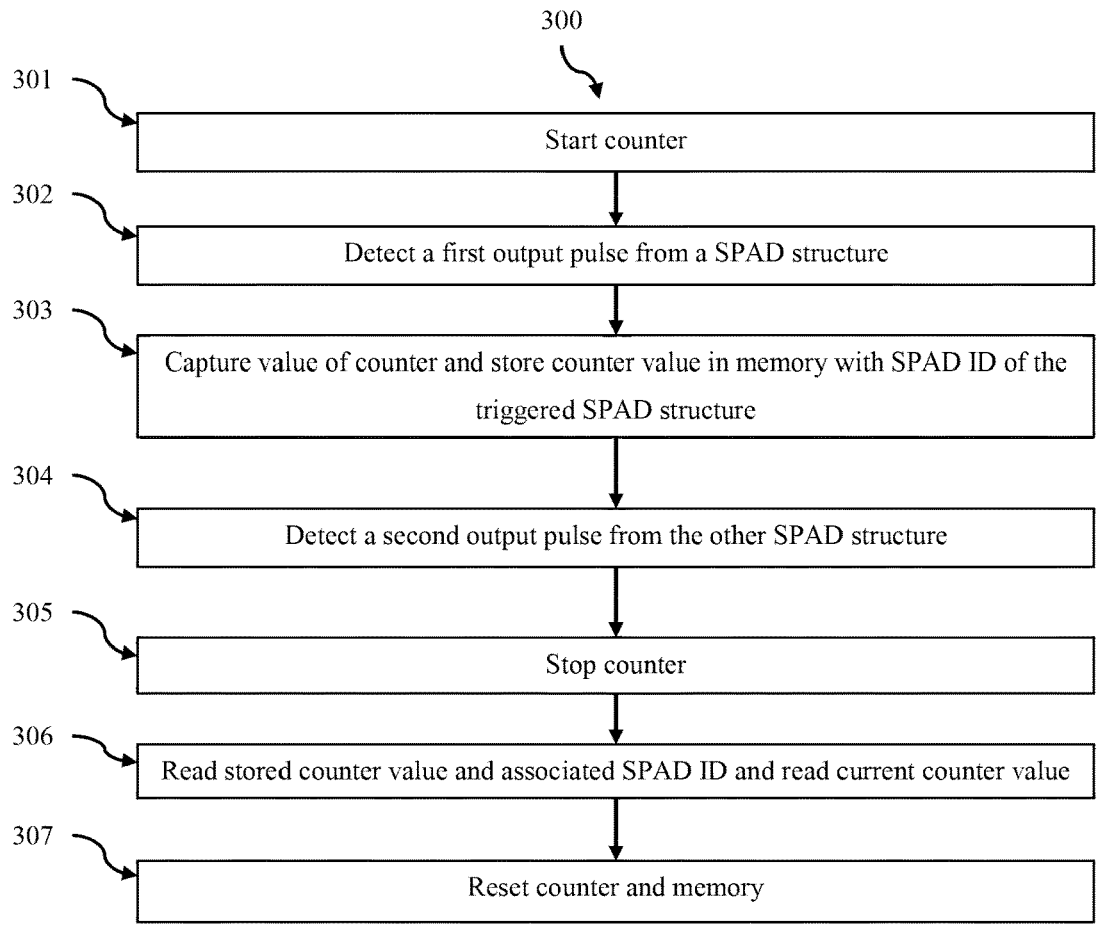
FIG. 3A is a flow chart of a method for recording triggering of dual SPAD structures in a SPAD cell according to an embodiment.

FIG. 3A is a flow chart of a method 300 for recording triggering of a dual SPAD structures, such as those constructed according to FIG. 2B, according to an embodiment. In this embodiment each SPAD is only triggered once during a counting (or gating) period. That is triggered SPADs are not reset whilst the counter is counting, and counters are globally started and stopped, and SPADs are reset after the global STOP counter signal. At step 301 the counter is started. This may be started by a global START signal. In some embodiment the START signal is synchronised to Laser firing in a time of flight application. At trigger detection step 302 a first output pulse (or trigger pulse) is detected from a SPAD structure, for example by detecting the rise above a threshold value of the SPAD output. Note that this may be the first or second SPAD structure 120 or 121 and will be referred to as the triggered SPAD structure. Then at step 303 a value of the (common) counter is captured (or latched) and stored in a (common) memory with a SPAD ID of the triggered SPAD structure. If a second output (or trigger) pulse is detected from the other SPAD structure (step 304) then the counter is stopped (step 305). Alternatively if the second SPAD structure does not trigger, the counter continues to count until a counter STOP signal is received or it reaches a maximum counter value (alternate route to step 305). At step 306 the stored counter value and associated SPAD ID is read and sent to a SPAD control circuit and the current counter value is read and sent to the SPAD control circuit. Determination of whether the other SPAD triggered (and it's associated ID) can be inferred by studying the value of the counter, and if required, the value of the SPAD ID stored in memory. If the other SPAD did not trigger then the current counter value will be either the maximum counter value, or the value at which the global STOP signal was sent. If it is not equal to the appropriate maximum or global stop value, then it can be determined the other SPAD triggered at the time of the current counter value, and the SPAD ID can be determined (or inferred) by studying the SPAD ID stored in memory (since it will not be the SPAD stored in memory). In a further step 307 the triggering circuit is reset after sending the stored counter values.

Resetting the triggering circuit comprises resetting the counter and clearing the memory. The SPADs may be rebiased if required. In some embodiments re-biasing is performed automatically by the quenching circuit, in which case further triggers from the SPAD may be inhibited until the reset signal is received, or alternatively re-biasing may be inhibited after triggering until a re-biasing signal is received, which may be the reset signal 318. In an alternative embodiment, no global counter stop signal is sent and the reset counter signal effectively performs a stop and reset. That is counter in a cell is free running and is only stopped if both the SPADs in the cell are triggered. In this embodiment a global counter is used to ensure the reset signal is sent before or at the counter maximum value. In this embodiment untriggered SPAD structures can be identified by reading the value of the global counter when the read signal 306 is sent so that if the counter in the cell has the same value as the global counter then the SPAD can be identified as untriggered.

Other variations on this method are possible, including the use of more than two SPADs, and the use of retriggerable SPADs, ie a SPAD may trigger multiple times during a counting (or gating) period. For example 3, 4, 5, 6, 7, 8 or more SPADs can be co-located in a single cell. In some embodiments the number of SPADs to include a cell is chosen to overall minimise space taking into account desired operation or design parameters such as size (eg number of bits) of the counter and layout complexity (eg how many metal layers are available in the CMOS process). In time of flight applications, the more bits for the counter, then the greater the range, thus the choice of counter size may be based upon intended operational requirements (eg desired range). For example 4, 5, 6, 7, 8, 9, 10, 11, 12, 13, 14, 15, 16, 17, 18, 19, 20 or more bit counters may be used. Increasing the counter size also has an effect on the cell size as counters take up considerable physical space on the substrate, and designing compact layouts in CMOS counters requires careful design. Similarly as the numbers of SPADs in a cell increases, more memory is required to store SPAD IDs which will thus take up more space in the cell. Memory typically can be laid out more compactly than a counter, and thus the size penalty for adding additional memory is less than the size penalty for adding additional bits to the counter. In some cases adding memory or large counters may generate greater layout complexity or non-uniform SPAD spacings (or pitch), and thus there may be some tradeoff associated with increasing the counter size or number of SPADs per cell. In some embodiments between 2 and 4 SPADs may be used with a counter of between 16 and 24 bits to gain a size reduction compared to equivalent single SPAD per cell arrangements. However, it is to be understood these are simply provided as possible ranges, and values outside of this range may still be implemented based upon operational (or application specific) requirements. For example some applications may require particularly long ranges and thus particularly large counters.

Figure 3B:
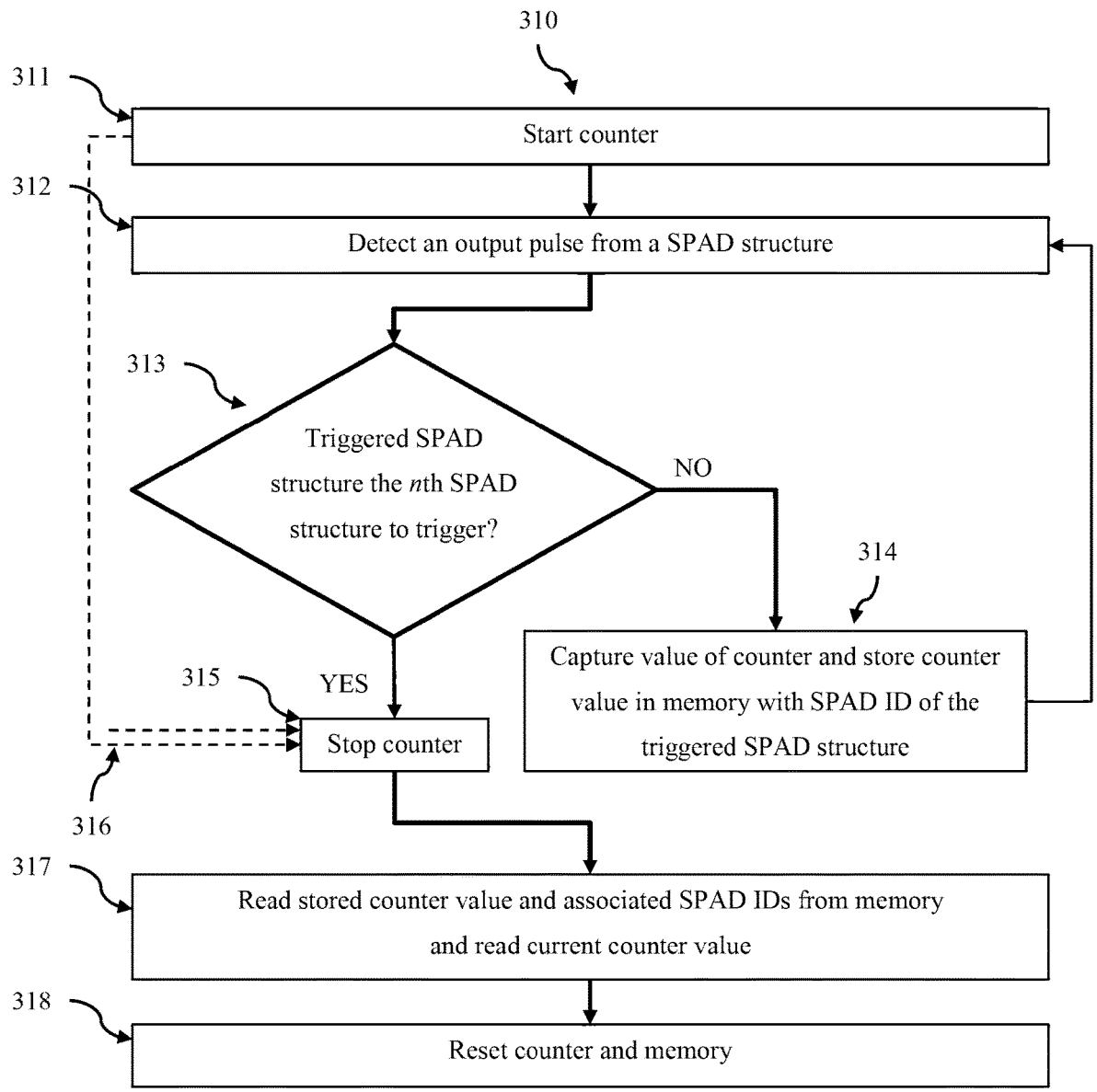
FIG. 3B is a flow chart of a method for recording triggering of a plurality of SPAD structures in a SPAD cell according to an embodiment.

FIG. 3B is a flow chart of a method 310 for recording triggering of a plurality (n) of SPAD structures in a SPAD cell according to an embodiment. In this embodiment each SPAD may only trigger once during a counting (or gating) period. That is triggered SPADs are not reset whilst the counter is counting, and counters are globally started and stopped, and SPADs are reset after the global STOP counter signal. At step 311 the counter is started. At trigger detection step 312 an output pulse (or trigger pulse) is detected from a SPAD structure, for example by detecting the rise above a threshold value of the SPAD output. Note that this initially this may be any of the n SPAD structures, and will be referred to as the triggered SPAD structure. At step 313 it is determined if the triggered SPAD structure is the n th SPAD structure to trigger. If the triggered SPAD is the nth SPAD structure (YES) then the counter is stopped as this is the last of the n SPADs to trigger. If not (NO) then the current value of the (common) counter is captured (or latched) and stored in a (common) memory with a SPAD ID of the triggered SPAD structure (step 314), and the counter continues to count, and the circuit continues to monitor if another SPAD triggers (ie return to step 312). If not all n SPADs trigger during the counting window, then the counter is stopped by a received global counter STOP signal or when it reaches a maximum counter value (alternate route to step 315 designated by dashed line 316). At step 317 the stored counter value(s) and associated SPAD ID(s) is read and sent to a SPAD control circuit and the current counter value is read and sent to the SPAD control circuit. Determination of whether all the n SPADs triggered, and the ID of the last (nth) SPAD to trigger can be inferred by studying the value of the counter, and if required, the value of the SPAD IDs stored in the memory. If not all n SPADs triggered then the current counter value will be either the maximum counter value, or the value at which the global STOP signal was sent. If it is not equal to the appropriate maximum or global stop value, then the current counter value will be the time of triggering of the last (nth) SPAD, and ID of the last SPAD to trigger can be determined (or inferred) by studying the SPAD IDs stored in memory, for example by a process of elimination. That is, if there are n SPADs then the SPAD ID of the last (nth) SPAD triggered is not required, as SPAD IDS if the first n–1 SPADs that triggered are stored, and thus the SPAD ID of the last (nth) SPAD can be inferred. This saves layout space as only memory sufficient for storing counters and ID values for n–1 SPADs is required. In a further step 307 the triggering circuit is reset after sending the stored counter values. Resetting the triggering circuit comprises resetting the counter and clearing the memory. In an alternative embodiment, the counter value of the last (nth) SPAD triggered is also stored in memory with the SPAD ID and the counter is not stopped by triggering of the last SPAD. The counter can then be free running, and either stopped on a global STOP signal 316, or reset on the reset signal 318. In this embodiment a global counter is used to ensure the global stop or global reset signal is sent before or at the counter maximum value.

Figure 3C:
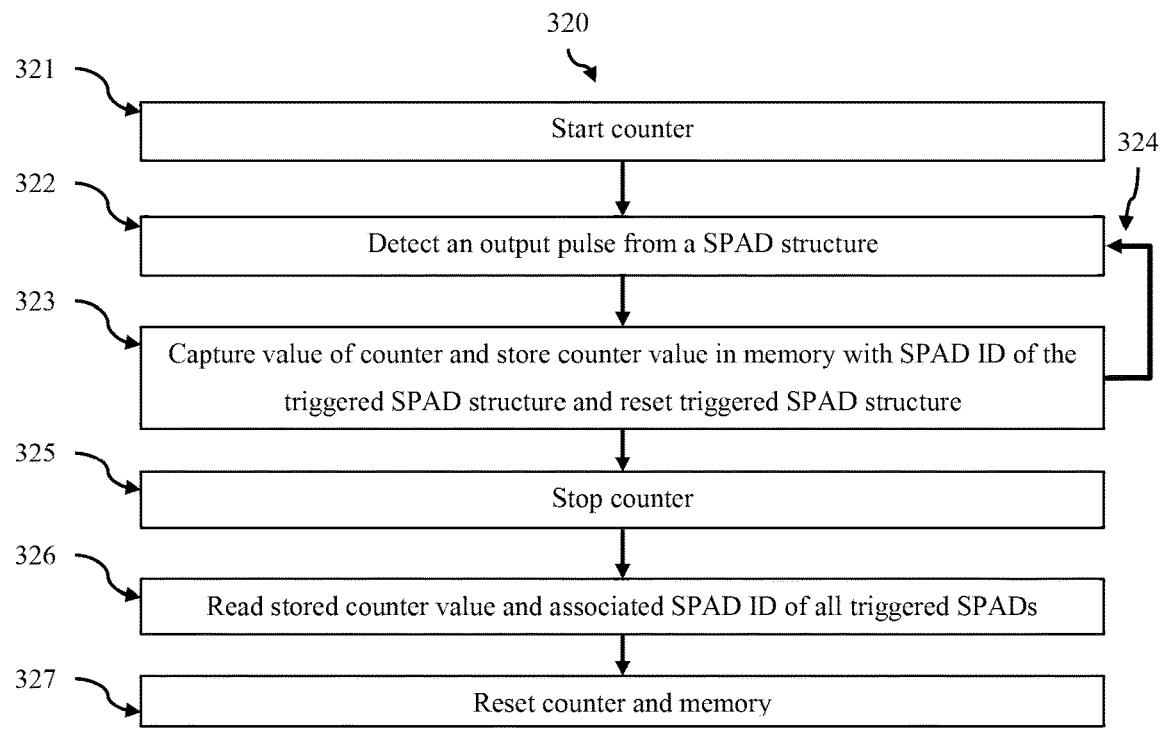
FIG. 3C is a flow chart of a method for recording triggering of a plurality of SPAD structures in a SPAD cell where the SPADs are retriggerable according to an embodiment.

FIG. 3C is a flow chart of a method 320 for recording triggering of a plurality (n) of SPAD structures in a SPAD cell according to an embodiment where the SPADs are retriggerable. That is after triggering the SPAD is reset whilst the counter is counting. At step 321 the counter is started. At trigger detection step 322 an output pulse (or trigger pulse) is detected from a SPAD structure, for example by detecting the rise above a threshold value of the SPAD output. Note that at each step this may be any of the n SPAD structures, and will be referred to as the triggered SPAD structure. At step 323 the current value of the (common) counter is captured (or latched) and stored in a (common) memory with a SPAD ID of the triggered SPAD structure. The counter continues to count whilst he triggered SPAD structure is reset, and the circuit continues to monitor for any SPAD triggers—whether a different SPAD structure or the same SPAD structure as an earlier triggered and reset SPAD structure (ie return to step 322, designated by arrow 324). The counter is stopped (step 325) by either a received global counter STOP signal or when it reaches a maximum counter value. At step 326 the stored counter value and associated SPAD ID of all triggered SPADs is read and sent to a SPAD control circuit. In a further step 327 the triggering circuit is reset after sending the stored counter values. Resetting the triggering circuit comprises resetting the counter and clearing the memory. In some embodiments the step of stopping the counter (step 325) could be omitted provided a reset counter signal is received prior to or at the maximum counter value. This reset counter signal could be a global reset signal sent to all cells in an array. This could be generated by a separate global counter of the same size (maximum count value) which when it reaches a maximum the count value issues the reset counter signal.

Figure 3D:
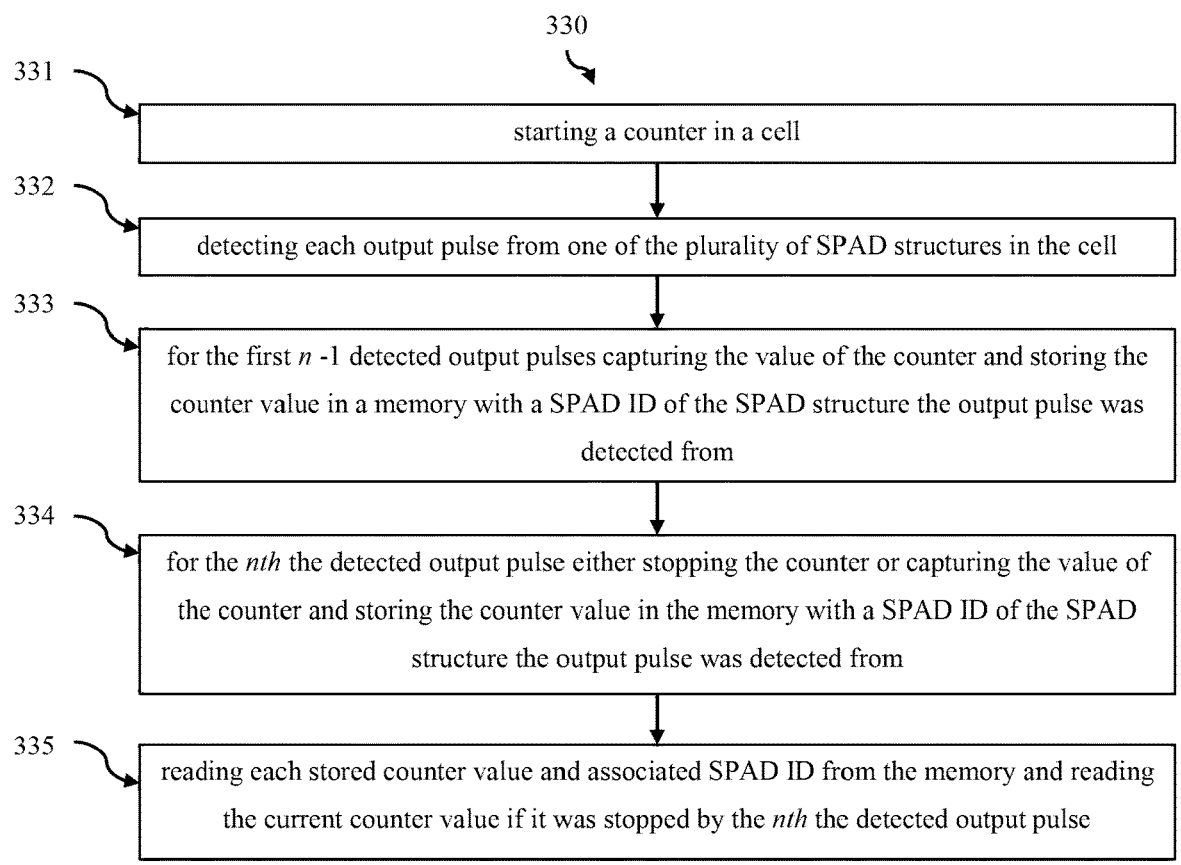
FIG. 3D is a flow chart of a method for recording triggering of a plurality of SPAD structures in a SPAD cell according to an embodiment.

The above three methods can be generalised into a generic method 330 which is illustrated in FIG. 3D. The first step is to start a counter in a cell 331. The next step is a monitoring or detecting step 332 which comprises detecting each output pulse from one of the plurality of SPAD structures in the cell. This step is performed continuously whilst the counter is counting up to the time the memory is read (step 336). At step 333, for the first n–1 detected output pulses, the value of the counter is captured and stored in a memory with the SPAD ID of the SPAD structure the output pulse was detected from. At step 334, for the nth the detected output pulse the method comprises either stopping the counter or capturing the value of the counter and storing the counter value in the memory with a SPAD ID of the SPAD structure the output pulse was detected from. Finally step 335 comprises reading each stored counter value and associated SPAD ID from the memory and reading the current counter value if it was stopped by the nth the detected output pulse. Thus if the SPADs are not retriggerable then at step 334 the counter may be stopped or if desired the counter value and ID may be recorded instead. If the SPADS are retriggerable then the SPAD that generated the output pulse is re-biased and for the nth and each subsequent detected output pulse the value of the counter is captured and the counter value is stored in the memory with a SPAD ID of the SPAD structure the output pulse was detected from.

As mentioned the captured counter value is stored along with a SPAD ID identifying which SPAD structure triggered. In one embodiment the SPAD ID is a single bit binary value or flag, such as 0 for the first SPAD 120 and 1 for the second SPAD 121. However in other embodiments, for example (but not limited to) in arrangements with more than two SPADs connected to the common triggering circuit, larger bit values could be provided (eg 2 bits, 3 bits, 4 bits etc). In one embodiment the value stored in the memory is comprised of a SPAD ID field of a predefined length followed by the counter field which will also be of a predefined length— typically the bit size of the counter. For example in the case of a 1 bit SPAD ID field, and 16 bit counter, the memory value with be a 17 bit value, similarly if the SPAD ID field is 2 bits and the counter is 16 bits then the memory value will be an 18 bit value. Thus the bit size of a memory value (or element) will be at least the bit size of the counter, plus the number of bits required to represent n−1 (ie 0, 1, . . . n−1). Additional bits may be reserved for other purposes. In one embodiment if there are n SPADs per cell and the SPADS are not retriggerable, then the memory will have a capacity (or size) to store n−1 values. If the counter is free running (ie it is not stopped by the last SPAD triggering) then the capacity of the memory may be n items. In other embodiments, the memory can store a predetermined number of counter values (ie triggering times). This allows multiple SPAD triggers from the same or several SPAD structures to be locally stored before all values are read out. If the SPADs are retriggerable then the capacity of the memory may be greater than n. As each extra value to be stored adds to the physical size of the memory in the cell, and as space within a cell is limited the maximum memory size will be chosen based on operational requirements. In one embodiment a multiplexor (MUX) can be connected to the counter and memory which is used to select which of the counter value or the memory value is read out, for example by receiving a select signal from the control circuit 3. In these embodiments the counter is assume to start at zero. However in other embodiments the counter could be started at a different value, provided that value was known. In another embodiment, the counter could be a free-running counter (ie never stopped), and instead of starting the counter, the initial value of the counter could be latched and stored. For example upon receipt of a start signal, the counter value could be read and stored. As each SPAD triggers the counter values would be read and stored along with SPAD IDs.

Figure 4:
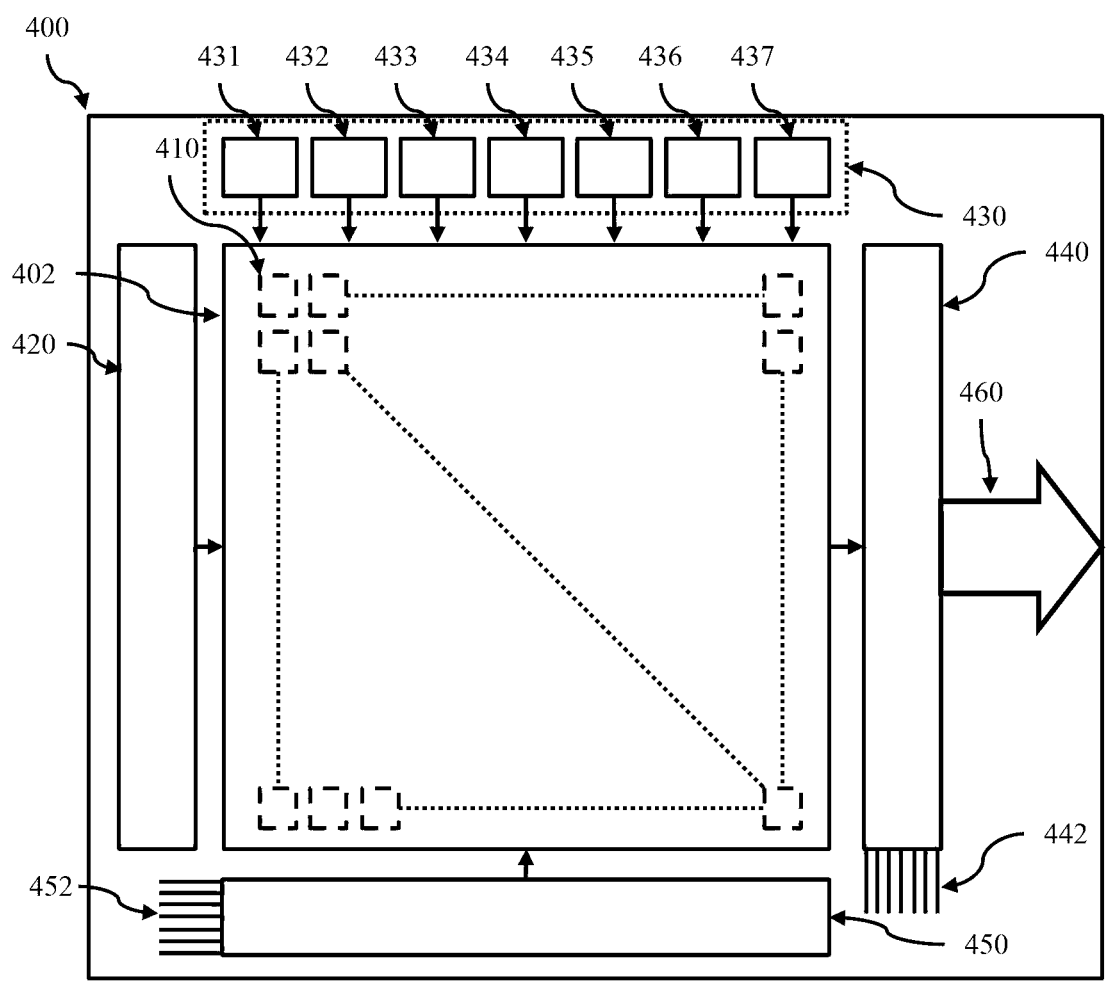
FIG. 4 is a schematic diagram of a SPAD array sensor according to an embodiment.

FIG. 4 is a schematic diagram of a SPAD array sensor 400 according to an embodiment. In one embodiment the SPAD array 402 comprises an array of SPAD cells 410. In one embodiment each SPAD cell comprises a single SPAD structure (ie 1 pixel per cell) such as illustrated in FIG. 2A. In another embodiment the SPAD array 402 comprises an array of SPAD cells with two or more SPAD structures per cell (eg 2, 3 4, 5, 6, 7, 8; ie multiple pixels per cell) such as the dual SPAD cell illustrated in FIG. 2B. In this terminology each SPAD is a pixel, and a cell may contain multiple SPAD structures and multiple pixels. The SPAD control circuit 3 comprises several distributed components. These include a power supply circuit 420, SPAD trigger control circuits 430, a row address circuit 440 and a column address circuit 450, which provide output data on a data bus 460. The SPAD trigger control circuits 430 comprise circuits that generate control signals to each SPAD in the array. In this embodiment these comprises a clock signal generator 431, a power enable (PWRENA) signal generator 432, a precharge (PRECH) signal generator 433, a start counter signal generator 434, an output enable bus signal generator 435, a read memory signal generator 436 and a reset counter signal generator 437. Each of these signal generators generate the corresponding signals (respectively): clock signal, power enable signal, start signal, output enable signal, read signal, and reset signal. The power enable signal (PWRENA) allows control of power to SPADs to prevent early triggering (ie SPADs are only operative when enabled). In this embodiment the power enable signal (PWRENA) is also used as the stop signal to counters (eg the global counter STOP signal). The precharge signal allows repriming (re-biasing) of SPADs to allow retriggering. The start counter starts a counter in each SPAD cell to allow TOF data to be determined, as the counter counts each clock cycle so the TOF is the counter value times the clock period. The output enable enables the output data bus to allow values to be read from SPADs. The read signal triggers reading of counter and/or memory values, and the reset signal resets the counter. In one embodiment the array is a n×m array and the row address circuit is a $2^n$ to 1 multiplexor circuit with n row selector inputs 442 (each corresponding to a bit), and the column selector circuit is a $2^m$ channel decoder with m column selector inputs 452.

An embodiment of this SPAD array was constructed using a 128×128 dual cell SPAD array (ie 128×128×2 or equivalently 128×256 SPADs) to give 32768 SPADs (or pixels). In this dual cell arrangement each cell comprised two SPAD structures and associated analog and digital processing circuits adjacent the SPAD structures. The SPAD structures and chip was designed using Silterra technology (http://www.silterra.com), specifically using Silterra's CL130H32 process design kit (http://www.silterra.com/cl130h32.html). The options used for this high voltage 130 nm CL130H32 CMOS technology include six metal layers, a SRAM module, and high, middle and low voltage options. In this embodiment each cells was 75×75 microns, with each SPAD structure having a diameter of 30 microns, and the overall chip dimensions were 10.12 mm×10.12 mm. The Anode connection of the SPAD is connected to VNEG=−28V, and the Cathode is connected to an Active quench and Recharge Circuit (Trigger Circuit). The Quantum Efficiency (QE) for the SPAD device was measured to be 11.3% @($\lambda$=532 nm, Vex=2.3V, DCR=210 cps).

In this embodiment, the power supply circuit 420 provided 0V, 1.8V, 3.3V power rails, a 3.3V VPOS signal, and a −28V VNEG signal. The clock signal generator 431 was a 600 MHz clock, and the data bus 460 was an 18 bit data bus. In this embodiment each SPAD cell contains 2 SPAD structures. TOF data is recorded for each SPAD using the same 1×16-bit counter. The output DATA BUS from the chip was 18 bits wide: 16 bit Counter (ToF resolution) Value+2 bit SPAD ID.

Operation of the SPAD sensor was as follows. When the global START signal 434 is asserted, for example a signal synchronized with a LASER pulse being transmitted in a LIDAR setup, all counters (in every cell) start counting. When a photon event occurs causing avalanche, the SPAD breaks down and current flows through the SPAD, quickly discharging the voltage across the SPAD to below the breakdown voltage. The active quenching and recharge circuit will re-bias the SPAD. Additionally the SPAD can be re-primed for another avalanche by re-pulsing the precharge signal 433.

Once the first SPAD breaksdown in a cell, a trigger circuit latches the event and the free running counter value (16 bit value) is read and stored in memory. The SPAD ID is also recorded in memory (2 bit). When the second SPAD fires in the cell, a trigger circuit then STOPS (or latches) the free running counter value. For example an AND or XOR gate can be used to generate a signal when all SPADs are triggered. A global STOP signal is sent to each counter at the end of a time out (or gating) period to stop any running counters (ie to stop counters in any cells where zero or one SPADs triggered). In one embodiment a PWRENA signal disables counting (ie the PWRENA is equivalent to a global STOP signal). Each pixel/cell is addressed for readout via ROW and COLUMN address and the DATA bus is enabled by asserting the global OUTPUT enable signal. The counter value per pixel/cell can be read from out via an 18-bit tristate bus. If the input READ signal 436 is asserted then the contents of the memory can be read out via the 18-bit tristate bus 460. The RESET signal 437, resets the counter and memory.

Figure 5A:
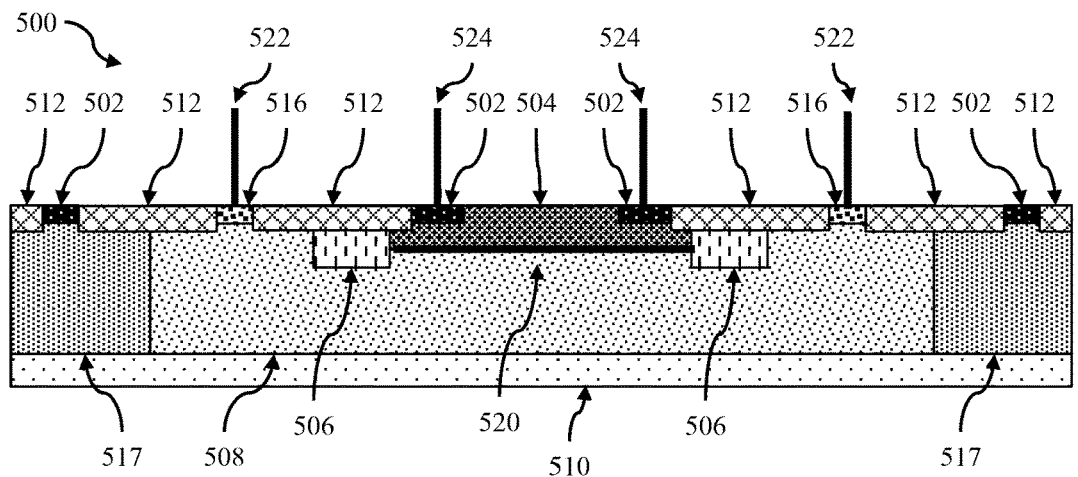
FIG. 5A is a cross section through a SPAD structure according to an embodiment.
Figure 5B:
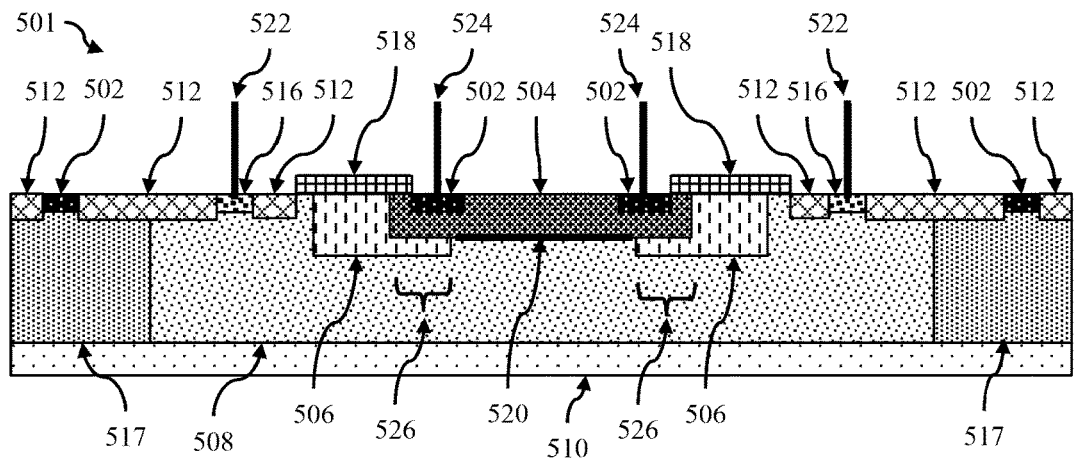
FIG. 5B is a cross section through a SPAD structure according to an embodiment.
Figure 5C:
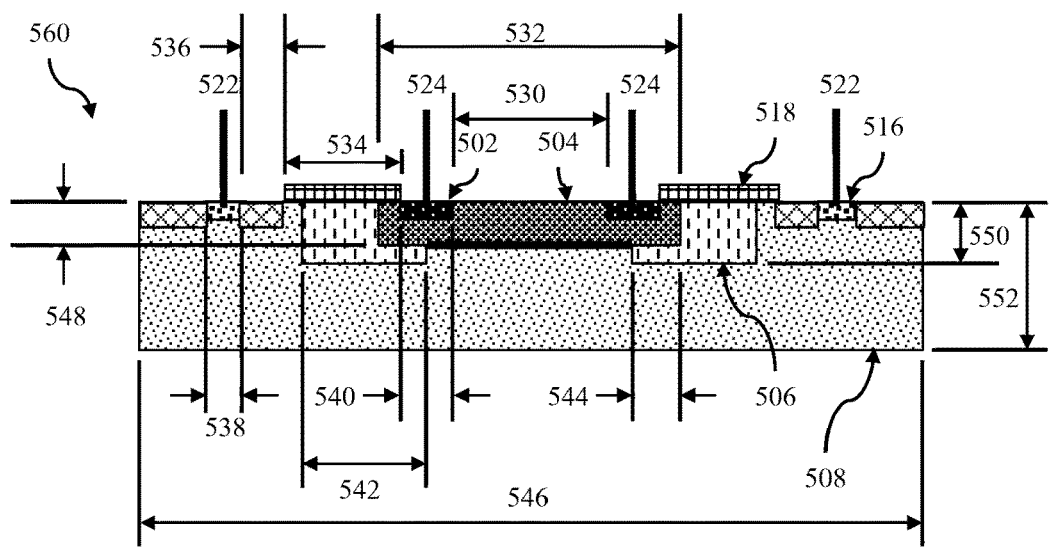
FIG. 5C is a cross section through a portion of the SPAD structure of FIG. 5B.
Figure 5D:
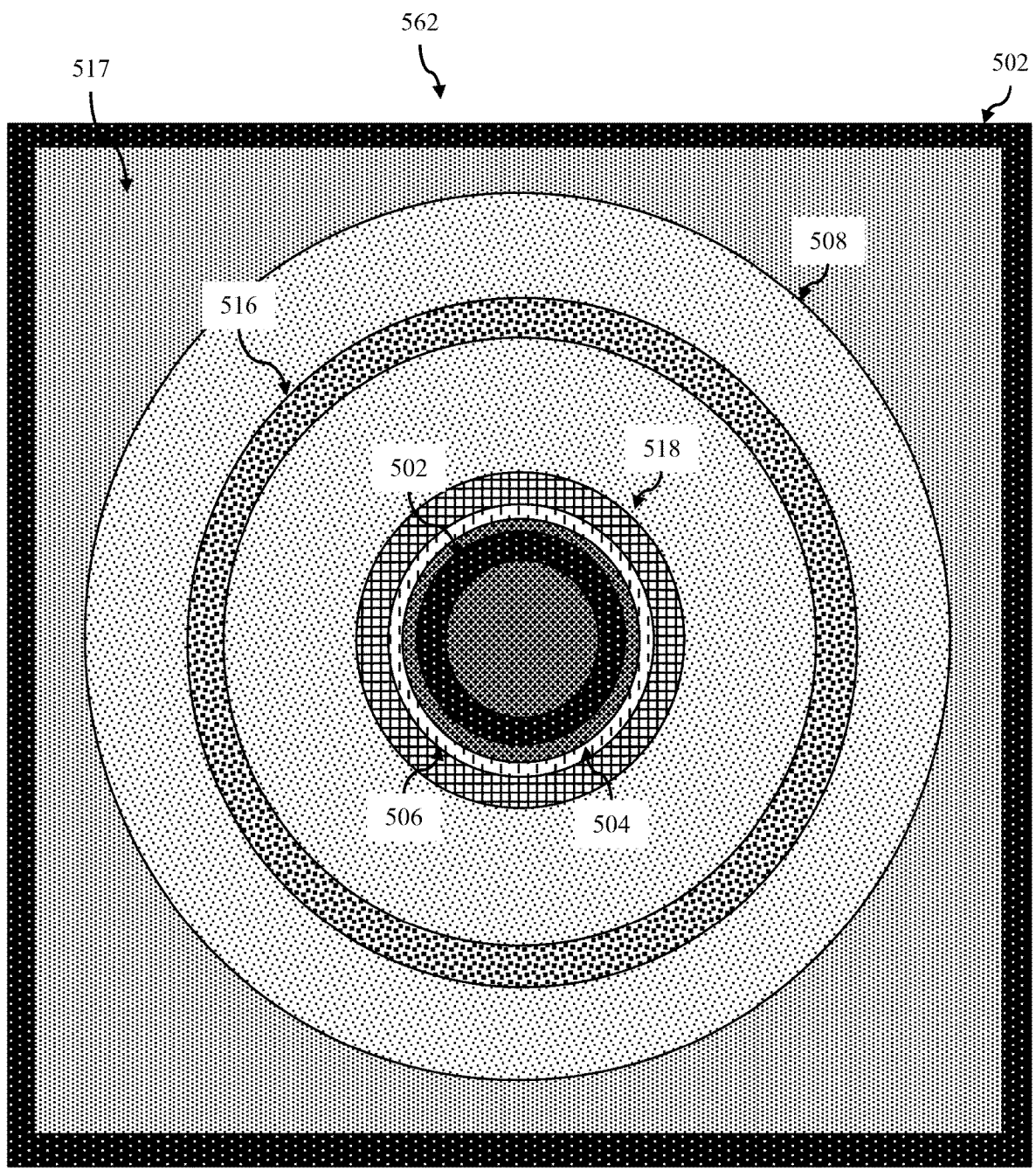
FIG. 5D is a top view of the SPAD structure of FIG. 5B.

Various SPAD structures may be used. FIG. 5A is a cross section 500 through a SPAD structure 20 according to an embodiment, and FIG. 5B is a cross section 501 through a SPAD structure 20 according to another embodiment in which the Pdrift and Pwell regions overlap. FIG. 5C is a close up of a portion of the SPAD structure of FIG. 5B showing the overlap. FIG. 5D is a top view of the SPAD structure of FIG. 5B.

Referring to FIG. 5A, the SPAD structure comprises a ring of highly doped p+ region 502 within a lightly doped p-well region 404 which defines the active region. The anode 524 is connected to the p+ region 502. The Pwell region 504 is layered over a lightly doped HVN well region 508 forming the junction region 520. The HVNwell sits on a P substrate (Psub) 510 and is surrounded by a HVPwell region 517. The active region 502 (within the p+ ring 502) is surrounded by a circular guard ring 506 comprised of low doped p-type material referred to as Pdrift embedded in or surrounded by the HVNwell 508. A n+ region 516 is located near on the top near the periphery of the HVNwell 508 and comprises the cathode connections 522. Shallow trench isolation using a Silicon Dioxide layer 512 is used to isolate the p+ and n+ regions, and act as a photo-protective layer to covers the guard ring and the surface of the HVnwell region 508 and p-type HV Pwell region 417. The active area of the SPAD structure is defined by the inner edge of the anode ring exposing the p+ and pwell region to incoming photons. Upper layers, including inter-metal dielectric, additional metal layers and passivation have been omitted for clarity. The SPAD device uses the Pwell (Anode) and HV-Nwell (Cathode) reverse breakdown diode junction of the Silterra C130H32 process (P type substrate).

A dc voltage is constantly applied across this diode slightly beyond reverse breakdown, this is approximately −30V. The anode (Pwell) of this diode is usually biased at BV (~−30V) and the cathode (HVNwell) can be adjusted anywhere between 0 to +2.5V (this represents the voltage bias 'beyond' breakdown). This means the total voltage from cathode to anode is slightly greater than the breakdown of the diode. In operation the SPAD is 'constantly' biased slightly beyond this reverse breakdown point. This high voltage creates a very strong electric field across the Pwell/HVNwell junction, which is exactly what is needed when a photon hits it causing impact ionization and the SPAD starts to avalanche. Integrated electronics detect this avalanche effect and the subsequent large current flow initiated by the photon.

The SPAD of interest is created between the Pwell (Anode) and HVNwell (Cathode) junction. To achieve good SPAD performance it is desirable that the avalanche breakdown of the SPAD takes place within the area of the junction rather than at the periphery. The aim is to control avalanche breakdown at the center, or laterally in the middle along the Pwell/HVNwell junction (depletion region), so a photon can initiate it, not something else. In other words when creating the high electric field of the Pwell/HVNwell junction it is desirable to avoid Premature Edge Breakdown" (PEB) of this junction. This usually happens at corners or edges of the SPAD structure.

FIG. 5B is a cross section 501 through a SPAD structure 20 according to an embodiment which was designed to improve the performance over the design illustrated in FIG. 5A. FIG. 5C is a close up of a portion of the SPAD structure of FIG. 5B and FIG. 5D is a top view 562 of the SPAD structure of FIG. 5B. In order to improve performance, for example by reducing the PEB and/or the Dark Count Rate (DCR), a number of techniques were used. One technique is to increase the breakdown voltage at the edges of the junction, for example by using lightly doped guard rings, so as to maximize the probability that the avalanche is initiated in the centre of the multiplication region (or depletion region). In modern CMOS processes Shallow Trench Isolation (STI) is used to isolate transistors on a chip. The STI is etched everywhere so that all the p+ and n+ implantations are surrounded by STI to improve isolation. However the interface between implantation areas and STI can create centres for carrier generation. If these are near the active area (P+/Pwell) of the SPAD they can potentially trigger avalanche by thermal events rather than optical events. Thus in one embodiment the STI regions were separated by placing a polysilicon gate (Poly) 518 over the implantation area to improve performance by reducing or minimising the Dark Count Rate. This keeps the STI edge 512 away from the active area 502. Further to prevent the formation of a high-electric field within the thin-gate-oxide layer, the polysilicon gate is kept at the same potential as the P+/Pwell layers.

Thus in one embodiment the SPAD structure comprises a Pwell region comprising at least one anode, an active region and a Pdrift region in an implantation region, and a Nwell region comprising at least one cathode, wherein a top surface of the active region of the SPAD is exposed and a top surface of the Nwell region is covered with one or more shallow trench isolation (STI) regions, and a polysilicon gate (Poly) region is placed over a top surface of the implantation region apart from the exposed active region and extends over a portion of the top surface of the Nwell region to separate one or more STI regions from the implantation region.

Another technique implemented to reduce PEB was to avoiding abrupt doping profiles, which reduce the electric field gradients at the diode periphery. Through the use of simulations it was discovered that overlapping the Pwell region 504 and Pdrift region 506 creates a graded (less abrupt) junction with a lower electric field (or field gradient) across it, compared to the planar Pwell-HVNwell junction region illustrated in FIG. 5A. In the design illustrated in FIG. 5B, "guard" rings, in this case Pdrift/HVNwell diode are used. This Pdrift/HVNwell diode has a much higher breakdown voltage of ~−40V. This diode keeps the electric field contained. Through simulations it was found that using an overlapping Pwell 504 and Pdrift 506 rather than side-by-side arrangement creates a less concentrated (ie smoother or more uniform) field across Pwell/HVNwell junction thus reducing the likelihood of a thermal electron triggering avalanche breakdown.

FIG. 5C is a close up of a portion of the SPAD structure of FIG. 5B. An embodiment of the SPAD structure illustrated in FIGS. 5B and 5C was constructed with a total diameter of 30 microns which includes the guard rings. The active area 530 which is sensitive to photon absorption was a diameter of 5 microns. Further the Pwell width 532 was 7 microns, the Poly width 534 was 1 micron, the poly n+ gap 536 was 4.4 microns, the n+ width 538 was 1.3 microns, the P+ width 540 was 0.84 microns, the Pdrift width 542 was 1.3 microns, the width of the overlapping Pdrift Pwell region 544 was 0.8 microns, a Hvnwell width 546 of 26 microns, a Pwell depth 548 of 0.9 microns, a P drift depth 550 of 1 micron, and a Hvnwell depth 552 of 3 microns. In this embodiment the Pwell width was 7 microns with the active area 530 inset from the edge by 1 micron so that the active area was 5 microns wide and the overlap was 0.8 microns giving a ratio of overlap width to active area (0.8/5.0) of 0.16 (16%). The ratio of overlap width to P well radius was (0.8/3.5) 0.23 (23%).

As can be seen from FIGS. 5B and 5C, the SPAD structure comprises a Pwell region comprising at least one anode and an active region, a Pdrift region, and a Nwell region comprising at least one cathode, wherein the Pdrift region overlaps with the Pwell region. Further in this embodiment the Pwell region is a circular disk region extending from a top surface of the SPAD into the Nwell region, the Pdrift region is an annular region with a thickness greater than the thickness of the Pwell region and extending radially from the Pwell region, and extending beneath the Pwell region into the Nwell region to define an overlapping region. However, it is to be understood that other structures and arrangements could be used to generate the overlapping regions.

Figure 5E:
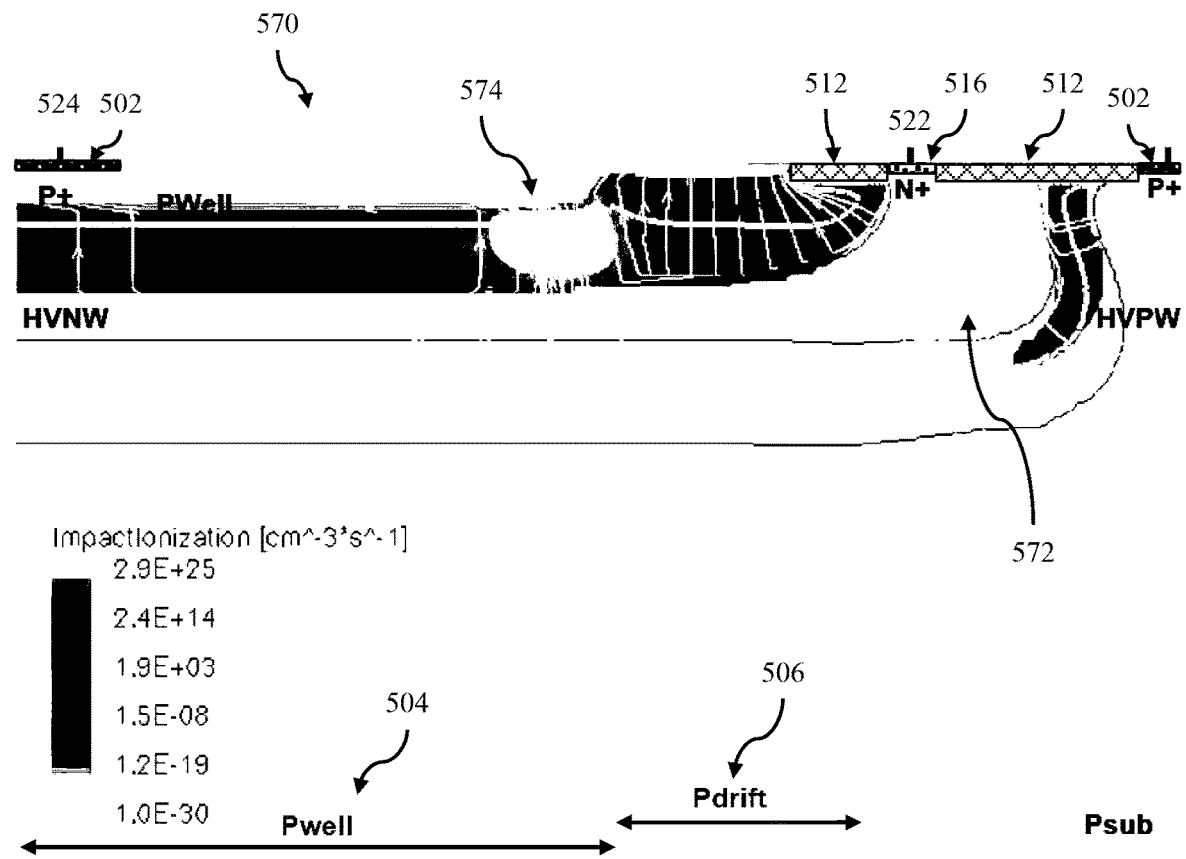
FIG. 5E is a contour plot of a simulation of the impact ionisation rate in a SPAD structure with adjacent Pdrift and Pwell regions according to an embodiment.
Figure 5F:
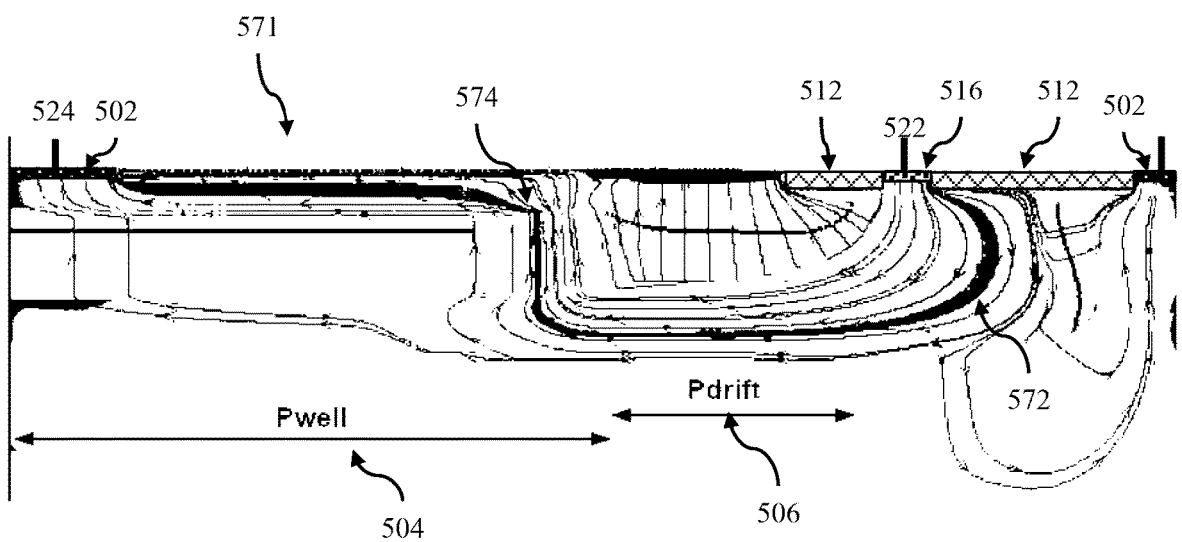
FIG. 5F is a further representation of the simulation shown in FIG. 5E illustrating the current flow.
Figure 5G:
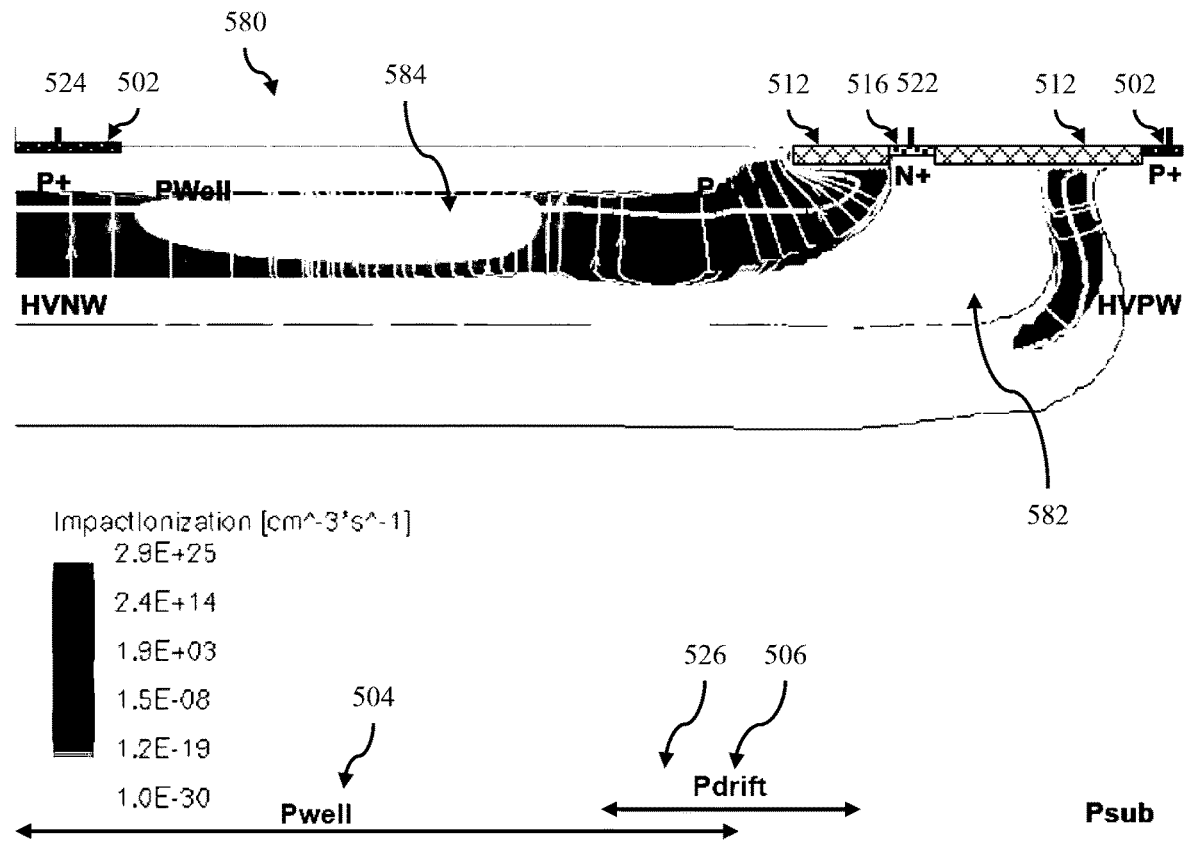
FIG. 5G is a contour plot of a simulation of the impact ionisation rate in a SPAD structure with overlapping Pdrift and Pwell regions according to an embodiment.
Figure 5H:
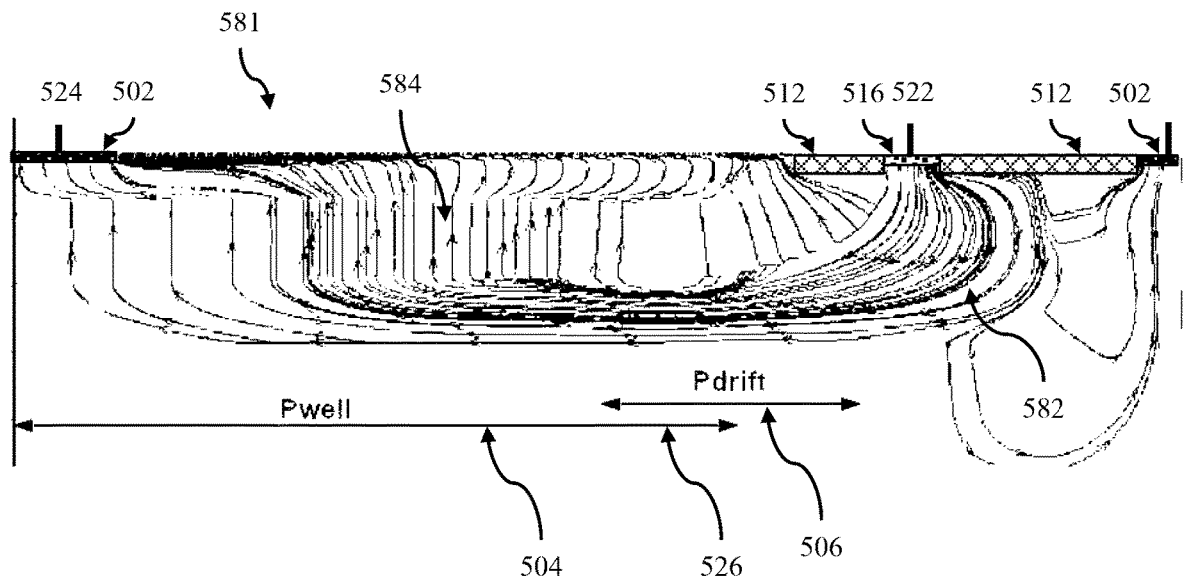
FIG. 5H is a further representation of the simulation shown in FIG. 5G illustrating the current flow.

The effect of overlapping the Pwell 504 and Pdrift 506 regions is illustrated in FIGS. 5E to 5H. FIG. 5E is a contour plot of a simulation of the impact ionisation rate in a SPAD structure with adjacent Pdrift and Pwell regions according to an embodiment, and FIG. 5F is a further plot of the simulation shown in FIG. 5E illustrating the current flow. Similarly FIG. 5G is a contour plot of a simulation of the impact ionisation rate in a SPAD structure with overlapping Pdrift and Pwell regions according to an embodiment, and FIG. 5H is a further plot of the simulation shown in FIG. 5G illustrating the current flow. The contour plots show in grey the impact ionisation rate, which is the number of electron-hole pairs being generated by a carrier per volume of time. The impact ionization rate is exponentially related to the electric field strength. Lines representing current flow are shown in white in FIGS. 5E and 5G are shown in black in FIGS. 5F and 5H (respectively). In these simulations the anode 524 is centrally placed to highlight the effect of overlapping the Pwell 504 and Pdrift 506 regions. FIGS. 5E and 5F shows an embodiment in which the Pwell 504 and Pdrift 506 regions are adjacent. The impact ionisation rate, and thus the electric field strength, is maximised in the region of the Pwell just after the Pdrift. From Figures 5E and 5F it can be seen that the current lines 572 near the cathode 522 and the current lines 574 after the edge of the Pdrift region after are closely packed, reflecting the large electric field gradients in these regions. This is compared with FIGS. 5G and 5H, in which the Pdrift region 504 and Pwell region 506 overlap 526. The region of maximum impact ionisation rate, and thus the maximum electric field strength region, is much wider than that shown in FIG. 5E. Again it can be seen that the current lines 582 near the cathode 522 and the current lines 584 after the edge of the Pdrift region after are more sparsely packed compared to those in FIGS. 5E and 5F, reflecting the smoother more uniform electric field gradients in these regions which acts to reduce the PEB.

Simulations reveal that no matter how wide the Pdrift is (in the Pwell adjacent to Pdrift configuration), breakdown still occurs at the Pwell-Pdrift interface curvature. It was found that by overlapping the Pwell with the Pdrift regions a less abrupt junction was created. In the case of a SPAD with a 20 micron diameter, simulations indicated that a less abrupt junction was obtained using either a 2 micron or a 4 micron overlap. In real word tests, favourable results were obtained from a 32×32 SPAD array in which an overlap of 1.5 microns was used for a SPAD with a 20 micron active diameter (ie ratio of overlap width to active area of 0.075 or 7.5%) and in a 256×256 SPAD array in which an overlap of 0.8 microns was used for a SPADs with a 5 micron active diameter (ie ratio of overlap width to active area of 0.16 or 16%).

Simulations indicated that most of the performance gain, in the sense of smoother field and reduced PEB, is achieved once an overlapping region is used, and that extending the overlapping region further into the active region does not produce a substantial further improvement, ie the performance gain is not linear with size of the overlap. Further it is thought that using very large overlaps which extend well into the active area (for example 0.5) may well impact on the active area available for photon detection. From the simulations and experiments it is estimated that similar effects should be observed for SPADs with different size active areas, but with approximately that same ratio of overlap width to active area. That is the ratio of overlap width to active area (overlap width/active area) can be used as a design guide, with ratios of 0.05, 0.1, 0.15, 0.2, 0.25 producing improved performance compared to structures using no overlap (ie adjacent Pwell and Pdrift regions). However as noted above even a small overlaps (0-0.05) does produce some benefit, as do larger regions, eg ratios of 0.25 to 0.45. Similarly another similar parameter that could be used is the ratio of overlap width to Pwell radius (eg 0.1 to 0.7). Another option when a non central anode is used (ie near the edge of the Pwell) is to use an overlap region extending to the inner edge of the anode, ie to the start of the active region, or within about 20% of the anode diameter of the edge.

The performance, for example as measured by the photon detection efficiency or response time, of the SPAD structure illustrated in FIG. 5A or 5B depends upon a range of factors, such as choice of substrate, dopant material, dopant concentrations, layer thicknesses and structure dimensions, including relative dimensions. A method of designing SPAD structures is discussed below.

Table 1 is table of various design parameters used for designing the SPAD structure illustrated in FIGS. 5B and 5C and which was used on the 128×256 SPAD array, and which can more generally be used to guide design of other SPAD structures:

TABLE 1

Design Parameters for SPAD structures.

| Parameter | Type | Description | Values & Notes |
|---|---|---|---|
| Active Diameter | Geometric | The diameter of the optically sensitive part of the SPAD structure | 5 µm |
| Pixel Pitch | Geometric | Spacing Between Active region Centres | In typical SPAD array designs reported in the literature pixel pitch is uniform. The design shown in FIG. 2B has |

TABLE 1-continued

Design Parameters for SPAD structures.

| Parameter | Type | Description | Values & Notes |
|---|---|---|---|
| | | | a pixel pitch of 30 μm between individual SPADs in a cell and 75 μm between SPADs from adjacent cells. |
| STI Masking with Poly | Geometric | The amount of separation of the P+/Pwell from the STI edge | It is assumed the larger the separation the lower the Dark Count Rates (DCR). |
| STI width | Geometric | This is the spacing between the edge of the Pdrift guard ring and the N+ (Cathode) connection. | It is unknown whether this has an effect. . |
| Well Extension | Geometric | The separation of the Pdrift guard ring edge to the HVNwell (Cathode) edge. | To avoid punch-through of the anode to the substrate the separation needs to be greater than the width of the depletion region. This will be doping and bias dependent. |
| Pdrift width | Geometric | Region of maximum impact ionization can be shifted with increase in Pdrift width | Breakdown still occurs at the Pwell-Pdrift interface 'curvature'. |
| Pdrift overlapped with Pwell | Geometric | Instead of side-by-side, Pdrift can overlap the Pwell. | Region of maximum impact ionization can be shifted to the planar region (depletion region) of the Pwell/HVNwell interface by overlapping. The amount of overlap used was 0.8 μm. In this case the ratio of overlap width to active area was 0.16. Ratios from .05 to .25 provide acceptable results (some performance gain can still be achieved outside of this range). |
| SPAD Bias | Electrical | The overall bias across the SPAD and the bias of each of the Cathode and Anode connections relative to the substrate. | The Anode should be biased to a negative voltage (relative to the substrate) that is just below the diode breakdown voltage. The cathode should be biased to a voltage that is close to the positive supply rail specification for the logic implemented within the process. Higher overall bias is likely lead to higher Dark Current Rates (DCR) whereas it is also likely to increase the probability of a single photon triggering avalanche, so a tradeoff is likely. |
| Temperature | Physical | The temperature of operation of the SPAD | Operation at low temperatures will reduce Dark Count Rates (DCR) whereas high temperatures will increase DCR. Variation from −25 C. to 40 C. is likely. |

Figure 6A:
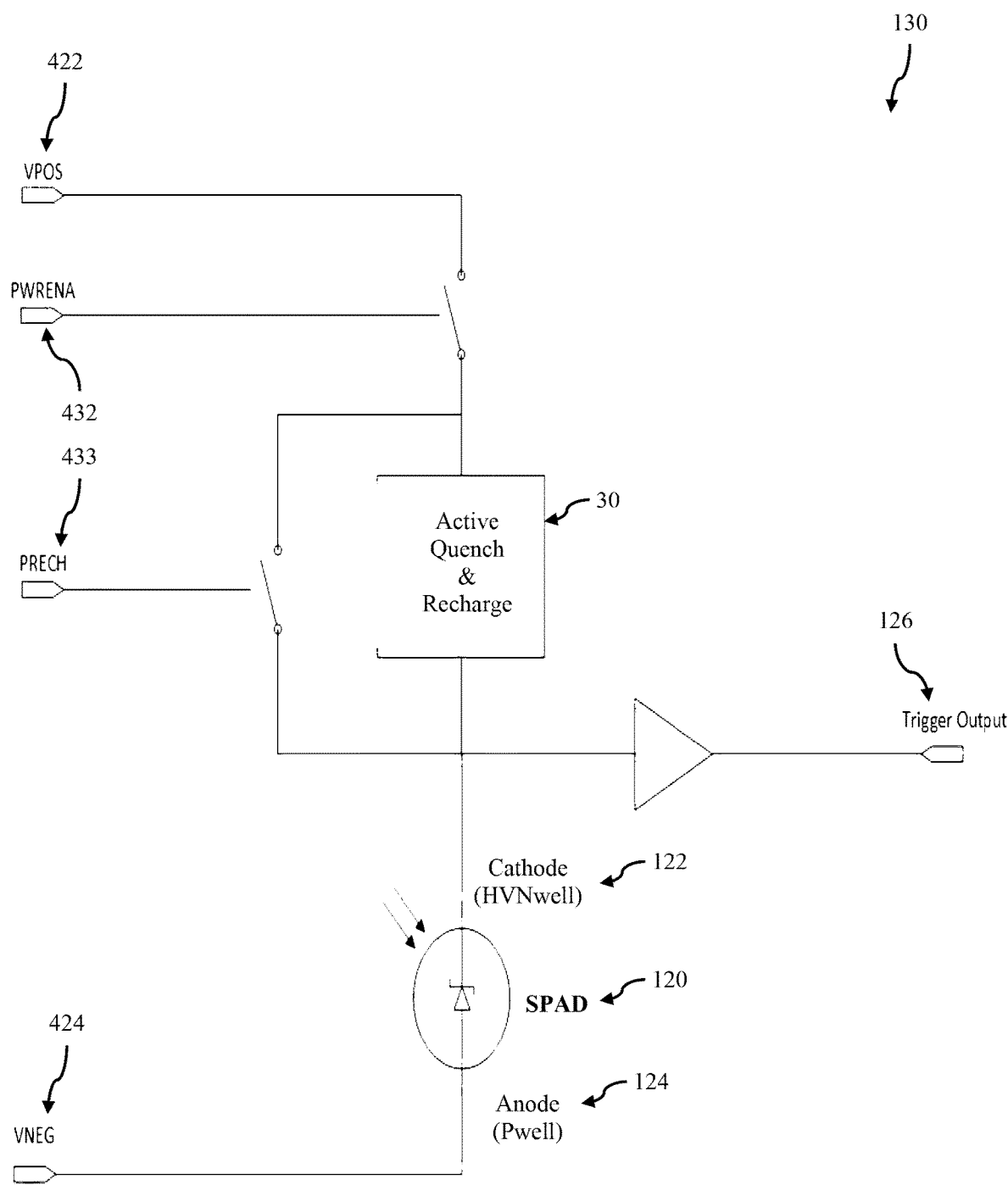
FIG. 6A is a schematic diagram of an analog active quench and recharge and SPAD circuit arrangement according to an embodiment.
Figure 6B:
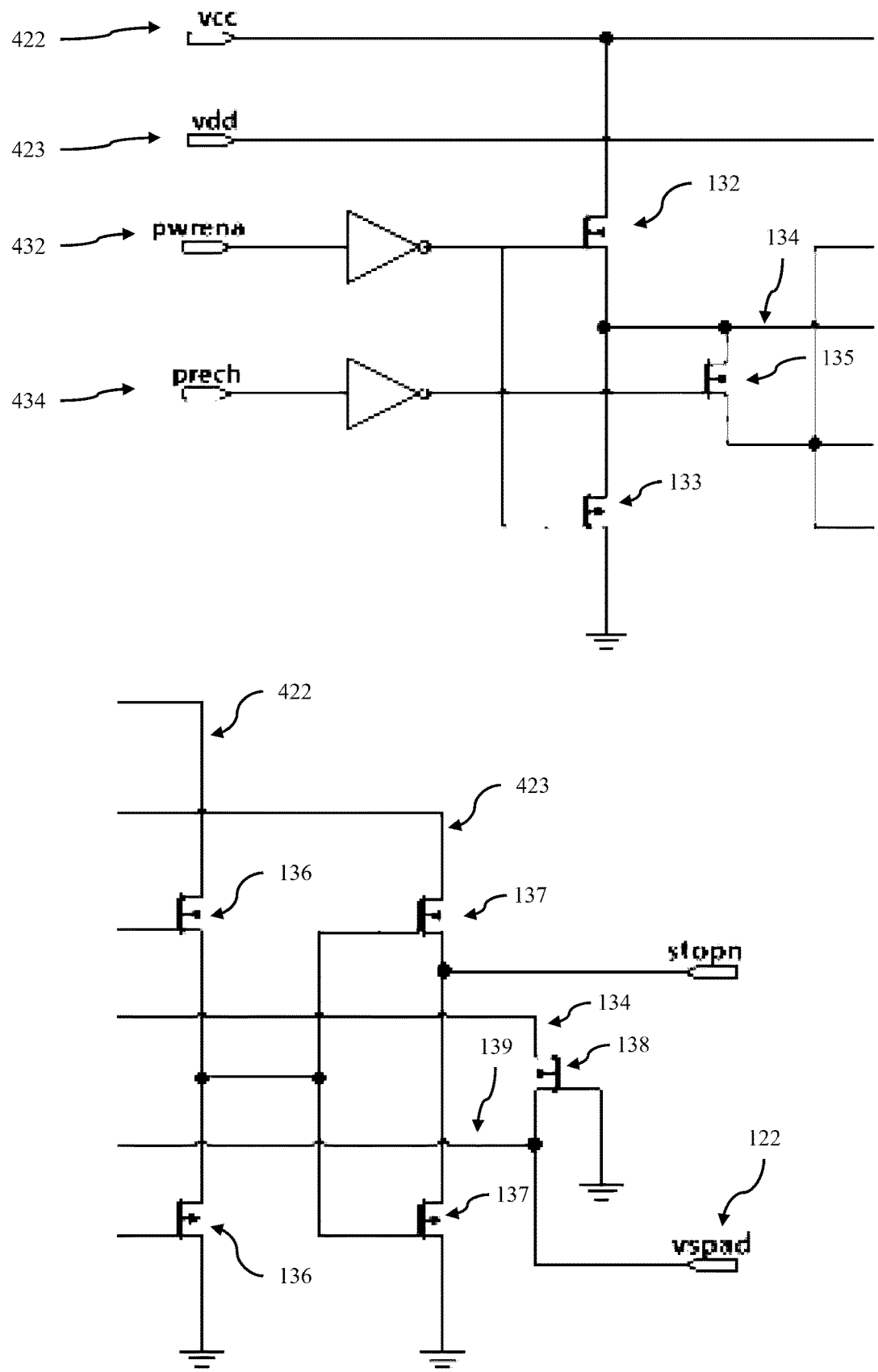
FIG. 6B is a detailed schematic diagram of a compact active quench and recharge circuit.

FIG. 6A is a schematic diagram of an analog quenching and SPAD circuit arrangement 130. Positive supply power 422 is provide to an active quench and recharge circuit 30 under control of the power enable signal 432. The active quenching circuit 30 is connected to the cathode 122 of the SPAD 120, and the anode 124 is connected to the negative voltage supply 424. A pre-charge signal 433 allows the active quenching circuit to be bypassed. A trigger output 126 is connected to the cathode 122 protected by a buffer.

Figure 7:
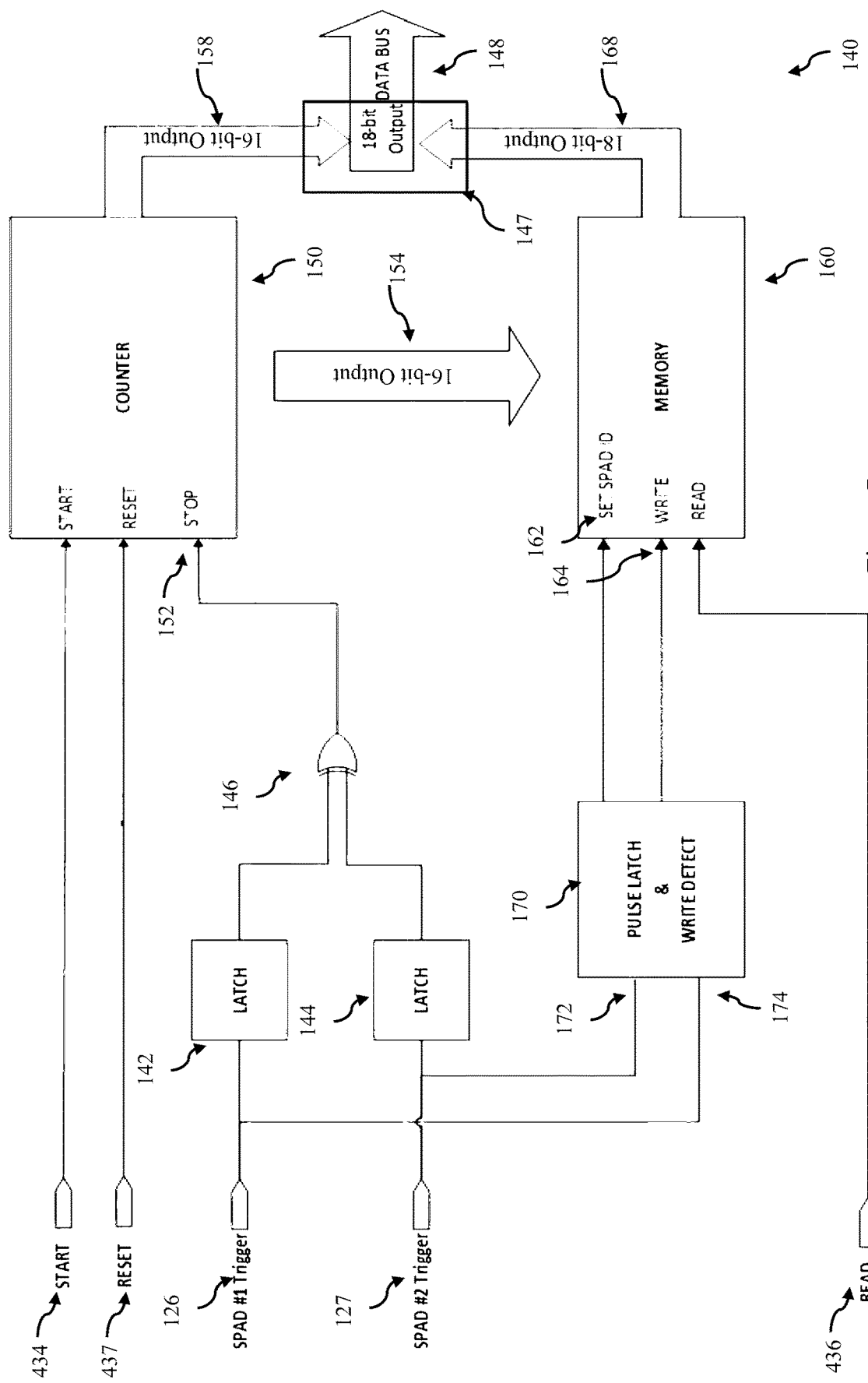
FIG. 7 is a schematic diagram of a trigger circuit according to an embodiment.

FIG. 6B is a detailed schematic diagram of a compact active quench and recharge circuit 130. Power is supplied via Vcc 422 and Vdd 423. The power enable signal 432 controls a pair of series connected transistors 132 and 133. A power line 134 connects is drawn from line connecting the two transistors (ie voltage divider arrangement) and is connected to quench transistor 138 which is connected to SPAD cathode 122, The pre charge 434 signal controls a further transistor connected to power line 134 and which provides a bypass line 139 to the SPAD cathode. This line also controls two transistors 136 arranged in series which in turn control two transistors connected in series 137 to generate a stop signal FIG. 7 is a schematic diagram of a trigger circuit according to an embodiment. The trigger circuit 140 is a digital logic circuit comprising the counter 150, memory 160 and pulse latch and write detect circuit 170. The global START signal 434 starts the counter 150. A pulse latch and write circuit 170 receives the first SPAD trigger output 126 on first input 172 and the second SPAD trigger output 127 on the second input 174, and monitors for triggering of either signal. Upon triggering of the first SPAD, the 2 bit SPAD ID of the trigger input that triggered is provided to the memory 160, at the SET SPAD ID input 162, and a WRITE signal 164 is sent to the memory 160 to read the 16 bit value of the counter 154 and store this value in memory 160. A first latch 142 is connected to the first trigger signal 126 and a second latch 144 is connected to the second trigger signal 144. When both SPADs have triggered, an XOR gate 146 stops the counter on STOP line 152. When a global READ signal 436 is received, the 18 bit (2 bit SPAD ID and 16 bit counter) value stored in the memory 168 is provided on the 18-bit bus 148, and 16 bit counter value is also provided on the bus 148, with control of which value is sent via a multiplexor (MUX) 147 (ie the memory is ready). The global RESET signal 437 resets the counter.

In the case that the SPAD cell contains more than 2 SPAD structures, this circuit can be extended for example by adding additional latches and modifying the pulse latch and write detect circuit 170 to take multiple inputs and feed multiple memories. The capacity of the memory maybe increased. The counter may be kept as a 16 bit counter or other size counters and memories including smaller (eg 12 bits) and larger (eg 24 bits) may also be used depending upon the application or other requirements.

Figure 8:
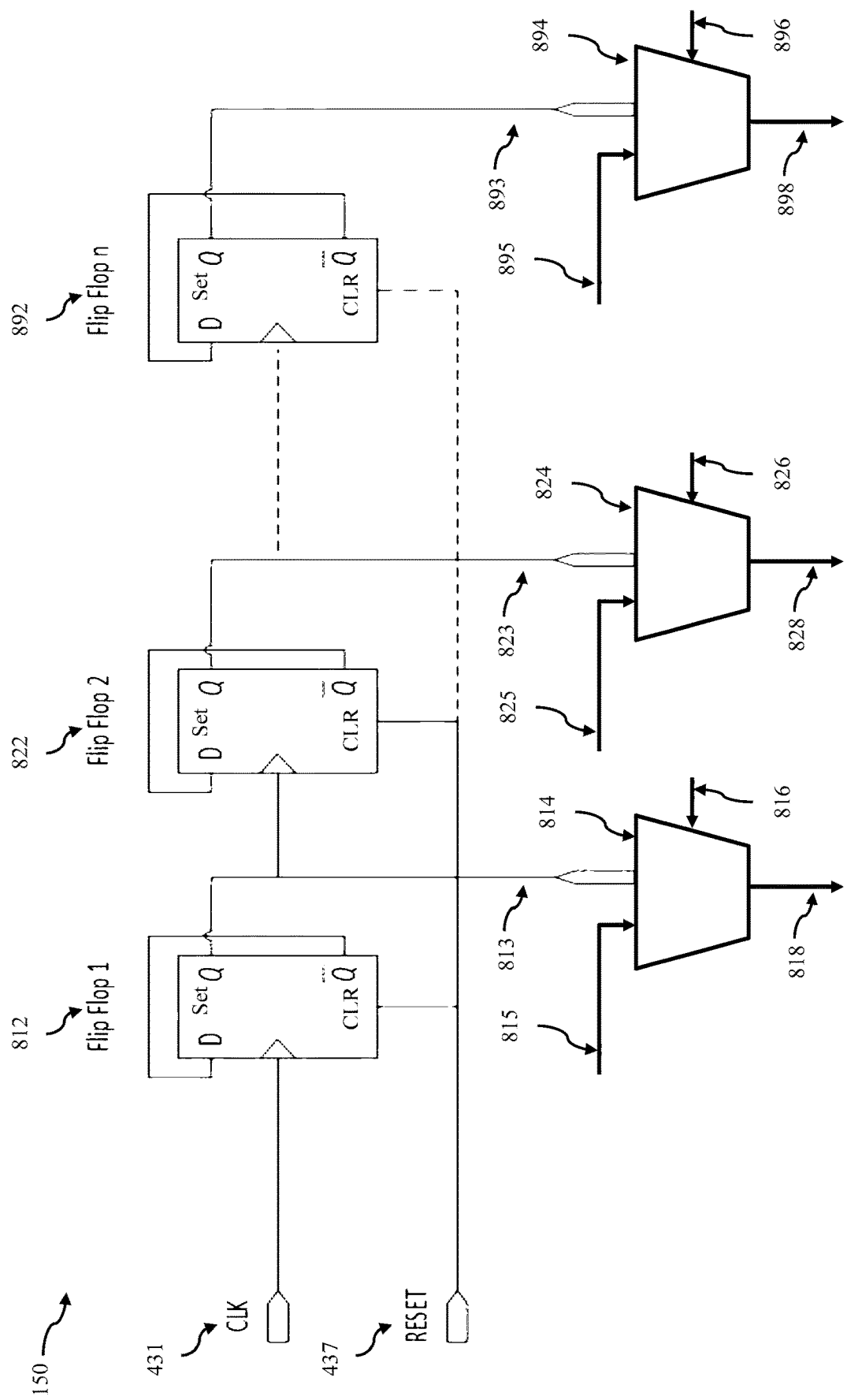
FIG. 8 is a schematic diagram of a counter circuit according to an embodiment.

FIG. 8 is a schematic diagram of a counter circuit 10 according to an embodiment. In one embodiment the counter function is implemented as a divide-by-16 ripple counter. It uses 16×D flip-flops configured in a cascading arrangement where the output of one feeds to the next. By connecting the D to $\bar{Q}$ of each D flip-flop a divide by 2 counter is obtained 814. The frequency at the output of Q compared to the input clock (CLK) frequency 431 is divided by two. Using 2 flip flops 812 and 822, a divide-by-4 ripple counter 824 is obtained. By cascading n flip flops 892, a divide by $2^n$ counter 894 is obtained. FIG. 8A also shows the incorporation of a multiplexor (MUX) with each Flip Flop. Thus the divide by 2 output 813 of flip flop 1 (812) is provided to a first MUX 814 along with memory line 815 corresponding to the first bit in a memory. A select line 816 enables selection of memory or counter value to generate first bit output 818. Similarly the divide by 4 output 823 of flip flop 2 (822) is provided to a second MUX 824 along with memory line 825 corresponding to the second bit in a memory. A select line 826 enables selection of memory or counter value to generate second bit output 828. This is replicated throughout the counter so that at divide by n output 893 of flip flop n (892) is provided to a nth MUX 894 along with memory line 895 corresponding to the nth bit in a memory. A select line 896 enables selection of memory or counter value to generate nth bit output 898.

Figure 9:
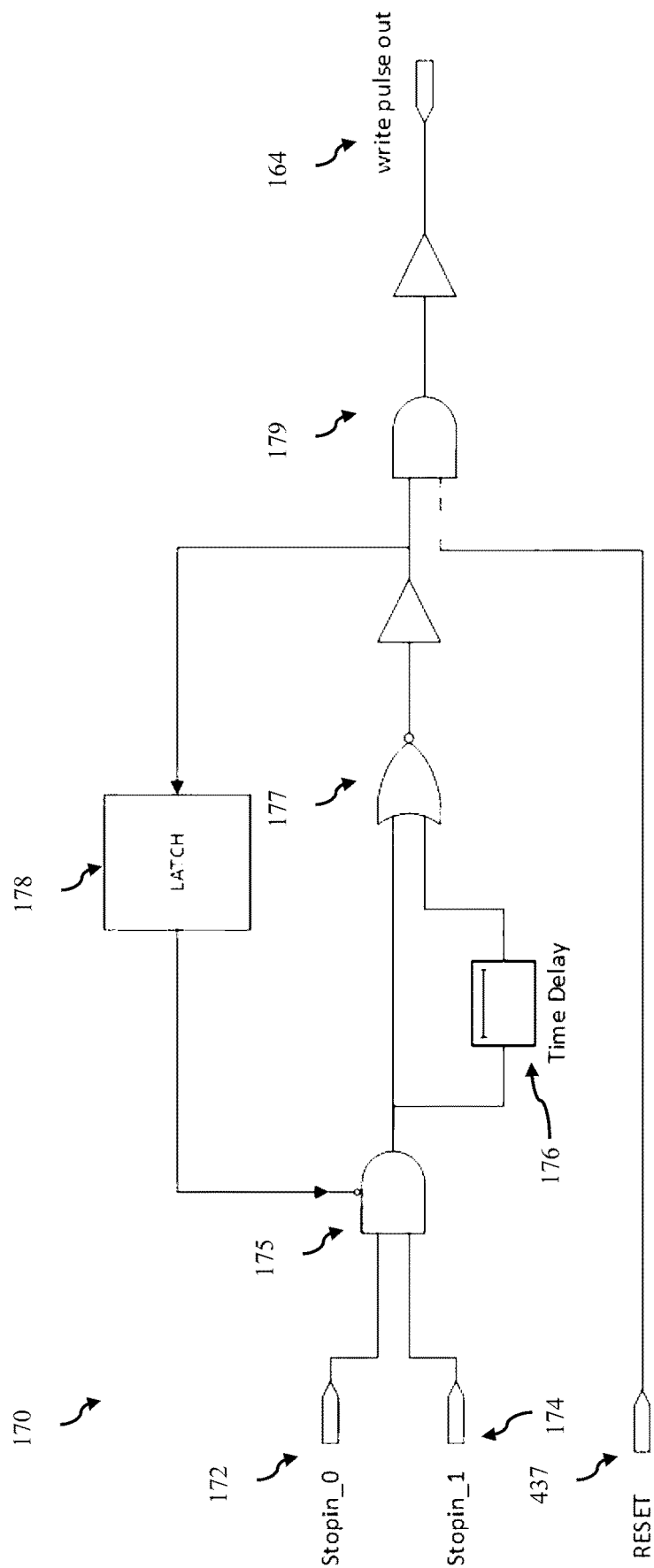
FIG. 9 is a schematic diagram of a pulse latch and write detect according to an embodiment.

FIG. 9 is a schematic diagram of a pulse latch and write detect according to an embodiment. This comprises trigger latches 172 and 174 for the first and second SPADs trigger pulses to an AND gate 175. The output is split and one lines is directed through a time delay circuit 176 and recombined with the original output in an XOR gate 177. The output is directed to a latch 178 which controls the first AND gate 175. The output is also provided to an AND gate 179 with the RESET signal 437 from which a write pulse output 164 is obtained. This embodiment is used for dual SPAD structures but can be extended if the number of SPAD structures is more than 2 based on the current design.

A 128×128 dual cell SPAD array was constructed based upon the above designs. However it is to be understood that the features and circuits can be used in other embodiments and variations. Further some features or circuits can be used without other features. For example the SPAD structures using the STI regions separated by placing a polysilicon gate (Poly) can be used independently of overlapping the Pwell and Pdrift regions. Further SPAD structures with either or both features can be used in one SPAD per cell arrays as well as in multi SPAD per cell arrays. Additionally the dimensions of the SPAD arrays can be varied. In one embodiment by using multi-layer CMOS technology, SPAD structures could be provided on the upper layer, with quenching circuits and digital triggering circuits located on a lower layer. Through layer electrical connections are used to electrically connect the SPAD with these circuits. The number of SPADs per cell can also be varied. Increasing the number of SPADs requires some modification of the triggering circuit by increasing the size of the memory. However the use of a common counter and memory for multiple SPADs in a cell can lead to a reduction in overall size compared to the overall size of the same number of single SPADs per cell.

Figure 10:
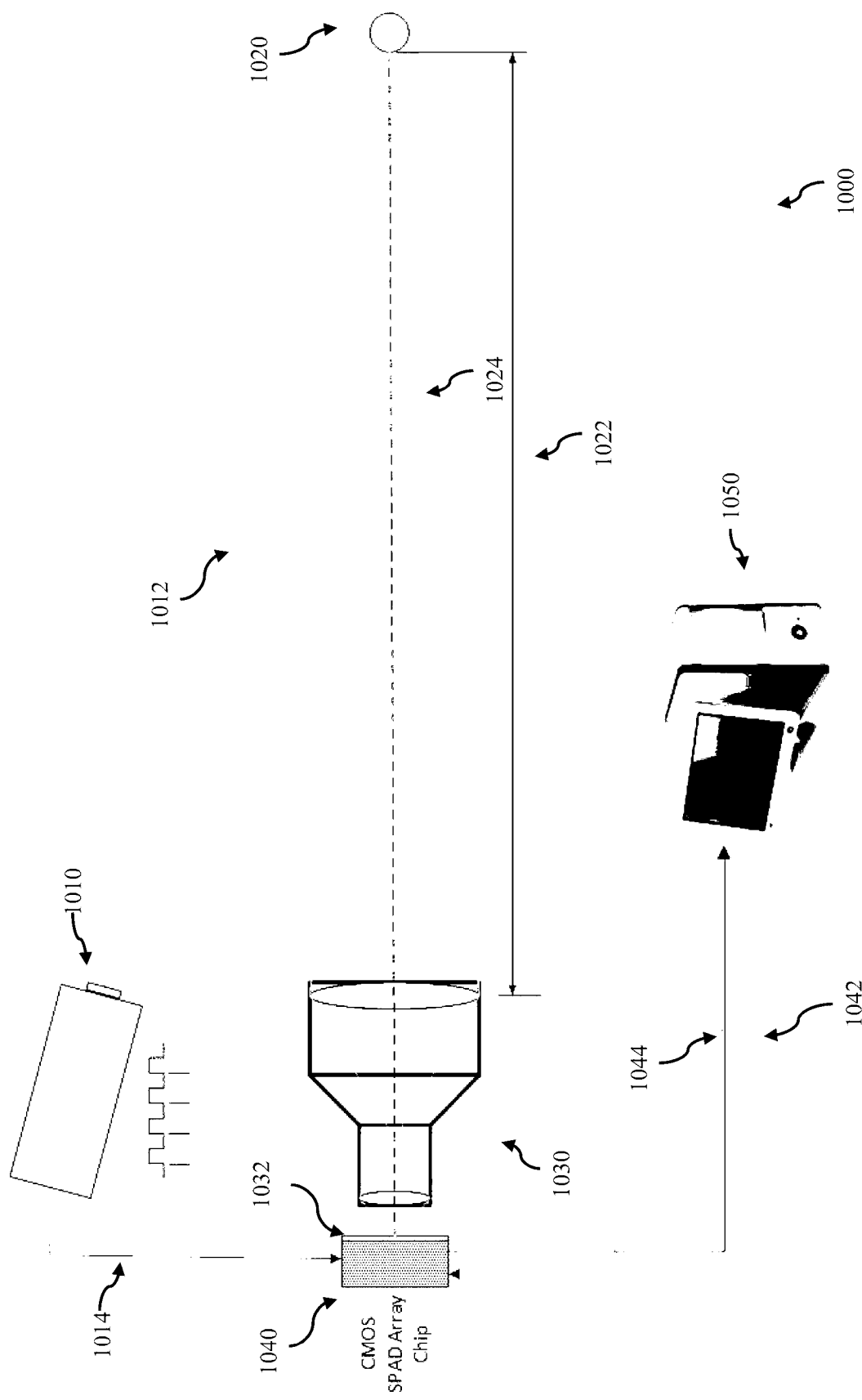
FIG. 10 is a schematic diagram of a Flash LIDAR system using a SPAD array according to an embodiment.

FIG. 10 is a schematic diagram of a Flash LIDAR system 1000 using a SPAD array according to an embodiment. The system comprises a pulsed laser 1010, for example a 25-100 Hz Pulsed Green (532 nm) Laser, which fires a laser pulse 1012 at a target 1020 which is some distance 1022 from the laser, and which reflects light 1024 back to the SPAD array sensor chip 1040. Upon firing of the pulsed laser 1010 a SYNC signal 1014 is provided to the SPAD array sensor chip 1040 to reset SPADs and start counters. An optical assembly 1030 including a micro lens array 1032 focuses the reflected light from the target 1024 onto the SPAD array, triggering individual SPADs. A computing device 1050 sends row and column read signals to the SPAD array 1042, and the data from the SPAD array is readout 1044 over a bus and stored on the computer 1050. For example in the 128×128 dual SPAD, 16384 pixels are read out with each pixel readout providing 2×16 bit counter values (one per SPAD) corresponding to the triggering value/time of the SPAD. The Time of Flight (ToF) to the SPAD in the pixel can then be determined by multiplying the counter value, which is the number of counts since the SYNCH 1014 (ie counter start signal) by the clock period. The time of flight can then be converted to a distance to the target by multiplying half of the Time of Flight by the speed of light in the transmission medium (eg air). This procedure can be modified to take into account relevant calibration data as would be apparent to the person of skill in the art.

The computing device 1050 may be a microcontroller, Field Programmable Gate Array (FPGA) or other processor based computing device such as a laptop, notebook, server, desktop, tablet, smart phone, etc. In one embodiment a FPGA board reads the ToF data from the SPAD chip and then communicates or uploads the data to a processor based computing device which displays the 3D image. The processor based computing device may be a system comprising of a display device, a processor and a memory and an input device. The memory may comprise instructions to cause the processor to execute a method described herein. The processor memory and display device may be included in a standard computing device, such as a desktop computer, a portable computing device such as a laptop computer or tablet, or they may be included in a customised device or system. The computing device may be a unitary computing or programmable device, or a distributed device comprising several components operatively (or functionally) connected via wired or wireless connections. The processor based computing device may comprises a central processing unit (CPU), a memory, a display apparatus, and may include an input device 140 such as keyboard, mouse, etc. The CPU comprises an Input/Output Interface, an Arithmetic and Logic Unit (ALU) and a Control Unit and Program Counter element which is in communication with input and output devices (eg input device and display apparatus) through the Input/Output Interface. The Input/Output Interface may comprise a network interface and/or communications module for communicating with an equivalent communications module in another device using a predefined communications protocol (e.g. Bluetooth, Zigbee, IEEE 802.15, IEEE 802.11, TCP/IP, UDP, etc). A graphical processing unit (GPU) may also be included. The display apparatus may comprise a flat screen display (eg LCD, LED, plasma, touch screen, etc), a projector, CRT, etc. The computing device may comprise a single CPU (core) or multiple CPU's (multiple core), or multiple processors. The computing device may use a parallel processor, a vector processor, or be a distributed computing device. The memory is operatively coupled to the processor(s) and may comprise RAM and ROM components, and may be provided within or external to the device. The memory may be used to store the operating system and additional software modules or instructions. The processor(s) may be configured to load and executed the software modules or instructions stored in the memory.

The Single Photon Avalanche Diode (SPAD) operating in Geiger Mode is a type of photo-detector that is designed and biased in such a way that it has the ability to detect a single photon. Creating a collection of SPADs (or array) is possible by miniaturizing SPADs devices so that all can fit onto a single integrated circuit chip. By accompanying each SPAD device with digital circuits it is then possible to create an individual pixel or smart detector that has the ability to perform both precise photon counting and timing functions. The SPAD (or SPAD array) sensor can then be used for applications that include imaging in low light, 3D, long-range, close-range with high resolution and molecules at ultra-high sensitivity. SPADs are particularly attractive in applications utilizing LIDAR (Light Detection And Ranging), which has a broad range of applications from military, meteorology, space, augmented reality, remote sensing and autonomous robotics.

SPAD based sensors can be used for applications which includes LIDAR imaging and detecting radiation-induced luminescence. One area of application is the development of a Time of Flight (ToF) camera image sensor based on SPAD array chip technology to capture quality 3D images using long-range LIDAR. The LIDAR will pulse laser light of a specific wavelength at a distant target, and the reflected photons will be directed towards the image sensor or SPAD array chip. In this case there is only a paucity of photons being received by the image sensor which is also required to resolve the time-of-flight (ToF) of individual photons. Hence the sensitivity (or a measure of quantum efficiency—QE) of each SPAD is an important factor in determining performance. By measuring the ToF between light emission and reflected signal detection, it is then possible to commute the distance between an object and the sensor using the speed of light. In order to acquire a 3D depth-resolved image of a scene, it is possible to measure the ToF information pixel-by-pixel by for an entire array of pixels. Each pixel contains the SPAD detector and associated timing electronics.

ToF techniques can be grouped into direct ToF or (dToF) and indirect (iToF) categories. Direct ToF methods directly measure the time delay by means of a very accurate timer or a Time-to-Digital (TDC) converter situated in the pixel. Depending on the accuracy or resolution of the timer, this method is typically used for long (kilometers) distance measurements and at very high precision (millimeter) depth resolutions. The Indirect ToF method in contrast reconstructs the time delay (hence distance) from the measurement of the phase delay of the reflected signal when compared to the periodic emitted light signal. This technique is more suited to short or medium distances (tens of meters) and with depth resolutions of some centimeters. For the iToF technique, either a continuous-wave iToF (cw-iToF) can be implemented, whereby a sinusoid modulated light source illuminates the scene and the returned signal is sampled a few times during the modulation period in order to compute the phase delay. Or a pulsed-light iToF (p-iToF) method where the illuminator uses square pulses of light.

SPAD devices offer far superior performance than any other detector technology of choice. Despite its advantages, solid state "integrated" SPAD arrays currently have far fewer pixels than other types of image sensors. This means that the SPAD image sensor would capture an image with much less detail than a typical CMOS/CCD-based camera. So there exists a need to overcome this limitation and provide high density resolution SPAD array's, combined with high sensitivity SPADs to deliver unparalleled functionality and high-quality imaging performance.

However to get good quantum efficiency or photon sensitivity, SPAD designs in the literature have often required special, proprietary, non-CMOS fabrication processes that prevent the integration of supporting circuitry onto the same silicon die. Whereby other SPAD designs that have been integrated in standard CMOS technology prove it is difficult to produce detectors with high photon sensitivity. The research challenge then is to produce a working high-density SPAD array chip using conventional CMOS manufacturing process, whilst maintaining a high quantum efficiency (QE). This will not only deliver cheap sensors but also only the easy integration of additional functionality opening up new and exciting applications. The current application provides SPAD arrays and SPAD structures capable of addressing these requirements Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software or instructions, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. Software modules, also known as computer programs, computer codes, or instructions, may contain a number a number of source code or object code segments or instructions, and may reside in any computer readable medium such as a RAM memory, flash memory, ROM memory, EPROM memory, registers, hard disk, a removable disk, a CD-ROM, a DVD-ROM, a Blu-ray disc, or any other form of computer readable medium. In some aspects the computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media. In another aspect, the computer readable medium may be integral to the processor. The processor and the computer readable medium may reside in an ASIC or related device. The software codes may be stored in a memory unit and the processor may be configured to execute them. The memory unit may be implemented within the processor or external to the processor, in which case it can be communicatively coupled to the processor via various means as is known in the art.

Further, it should be appreciated that modules and/or other appropriate means for performing the methods and techniques described herein can be downloaded and/or otherwise obtained by computing device. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a computing device can obtain the various methods upon coupling or providing the storage means to the device. Moreover, any other suitable technique for providing the methods and techniques described herein to a device can be utilized.

In one form the invention may comprise a computer program product for performing the method or operations presented herein. For example, such a computer program product may comprise a computer (or processor) readable medium having instructions stored (and/or encoded) thereon, the instructions being executable by one or more processors to perform the operations described herein. For certain aspects, the computer program product may include packaging material.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

It will be appreciated by those skilled in the art that the invention is not restricted in its use to the particular application described. Neither is the present invention restricted in its preferred embodiment with regard to the particular elements and/or features described or depicted herein. It will be appreciated that the invention is not limited to the embodiment or embodiments disclosed, but is capable of numerous rearrangements, modifications and substitutions without departing from the scope of the invention as set forth and defined by the following claims.

The invention claimed is:

1. A Single-Photon Avalanche Diode (SPAD) array comprising a plurality of SPAD cells, each SPAD cell comprising:
    a plurality (n) of SPAD structures;
    a plurality (n) quenching circuits, each quenching circuit connected to one of the SPAD structures; and
    a common trigger circuit connected to each of the SPAD structures and further comprising:
        a counter;
        a memory,
        a plurality (n) of latches each connected to a SPAD structure and a logic circuit connected to the plurality of latches and configured to stop the counter if all of the latches are triggered; and
        a pulse latch and write circuit with a plurality (n) of inputs, each input connected to a SPAD structure and configured to detect an output pulse from a SPAD structure, and each time an output pulse is detected the SPAD ID of the SPAD structure the output pulse was detected from is provided to the memory and the value of the counter is read and stored in memory with the SPAD ID.

2. The SPAD array as claimed in claim 1, wherein the counter is at least a 16 bit counter.

3. The SPAD array as claimed in claim 1, wherein the memory is configured to store n−1 values and each value has bit size of at least the bit size of the counter, plus the number of bits required to represent n−1.

4. The SPAD array as claimed in claim 1, wherein n=2.

5. The SPAD array as claimed in claim 1, wherein the array is at least a 128×128 cell array.

6. The SPAD array as claimed in claim 1, wherein each SPAD structure comprises a Pwell region comprising at least one anode and an active region on a top surface, a Pdrift region, and an Nwell region comprising at least one cathode and surrounding the Pwell region, wherein the Pdrift region is a lightly doped guard ring surrounding the Pwell region and partially extending beneath the Pwell region such that when viewed from above the Pdrift region overlaps with the Pwell region, and the Pdrift region separates the Pwell region from the surrounding Nwell region apart from a junction region formed at an interface of the lower surface of the Pwell region and the Nwell region.

7. The SPAD array as claimed in claim 6, wherein in each SPAD structure the Pwell region is a circular disk region extending from a top surface of the SPAD into the Nwell region, the Pdrift region is an annular region with a thickness greater than the thickness of the Pwell region and extending radially from the Pwell region, and extending beneath the Pwell region into the Nwell region to define an overlapping region.

8. The SPAD array as claimed in claim 6, wherein in each SPAD structure the ratio of a width of the overlapping region to the diameter of the active region is in the range 0.05 to 0.25.

9. The SPAD array as claimed claim 1, wherein each SPAD structure comprises a Pwell region comprising at least one anode, an active region on a top surface of the Pwell region, a Pdrift region in an implantation region, and a Nwell region comprising at least one cathode, and a junction region formed at an interface of the lower surface of the Pwell region and the Nwell region wherein a top surface of the active region of the SPAD is exposed and a top surface of the Nwell region is covered with one or more shallow trench isolation (STI) regions, and a polysilicon gate (Poly) region is placed over a top surface of the implantation region apart from the exposed active region and extends over a portion of the top surface of the Nwell region to separate one or more STI regions from the implantation region.

10. The SPAD array as claimed in claim 9, wherein in each SPAD structure the polysilicon gate is kept at the same potential as the Pwell region.

11. A method for recording one or more triggering times of a plurality (n) of Single-Photon Avalanche Diode (SPAD) structures in a cell of a SPAD array, the method comprising:
    starting a counter in a cell;
    detecting each output pulse from one of the plurality of SPAD structures in the cell;
    for the first n−1 detected output pulses, capturing the value of the counter and storing the counter value in a memory with a SPAD ID of the SPAD structure the output pulse was detected from; and for the nth the detected output pulse, either stopping the counter or capturing the value of the counter and storing the counter value in the memory with a SPAD ID of the SPAD structure the output pulse was detected from; and reading each stored counter value and associated SPAD ID from the memory and reading the current counter value if it was stopped by the nth the detected output pulse.

12. The method as claimed in claim 11, wherein for the nth the detected output pulse the counter is stopped.

13. The method as claimed in claim 11, wherein after each detected output pulse from one of the plurality of SPAD structures the SPAD that generated the output pulse is re-biased and for the nth and each subsequent detected output pulse the value of the counter is captured and the counter value is stored in the memory with a SPAD ID of the SPAD structure the output pulse was detected from.

14. The method as claimed in claim 11, further comprising stopping the counter prior to or at the same time as the reading step if it is not already stopped, and resetting the counter and memory after the reading step.

15. The method as claimed in claim 11, wherein the counter is at least a 16 bit counter.

16. The method as claimed in claim 11, wherein number of SPAD structures in the cell is two.

\* \* \* \* \*